US009583515B2

(12) United States Patent
Furukawa

(10) Patent No.: US 9,583,515 B2
(45) Date of Patent: Feb. 28, 2017

(54) SEMICONDUCTOR DEVICE INCLUDING SUBSTRATE WHICH IS USED IN DISPLAY DEVICES

(71) Applicant: Sharp Kabushiki Kaisha, Osaka-shi, Osaka (JP)

(72) Inventor: Hiroaki Furukawa, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 14/786,650

(22) PCT Filed: Mar. 4, 2014

(86) PCT No.: PCT/JP2014/055378
§ 371 (c)(1),
(2) Date: Oct. 23, 2015

(87) PCT Pub. No.: WO2014/174902
PCT Pub. Date: Oct. 30, 2014

(65) Prior Publication Data
US 2016/0064423 A1    Mar. 3, 2016

(30) Foreign Application Priority Data

Apr. 25, 2013 (JP) ................................. 2013-092963

(51) Int. Cl.
*H01L 27/12* (2006.01)
*H01L 23/522* (2006.01)

(52) U.S. Cl.
CPC ...... *H01L 27/1248* (2013.01); *H01L 27/1222* (2013.01); *H01L 27/1244* (2013.01);
(Continued)

(58) Field of Classification Search
CPC ............. H01L 27/1248; H01L 27/1222; H01L 27/1244; H01L 27/1259
See application file for complete search history.

(56) References Cited

U.S. PATENT DOCUMENTS 8,803,172 B2 *   8/2014   Kim ................... H01L 27/3248
                                                       257/72
2002/0173155 A1   11/2002  Hiromasu et al.
(Continued)

FOREIGN PATENT DOCUMENTS

JP    11-024101 A    1/1999
JP    11-153809 A    6/1999
(Continued)

OTHER PUBLICATIONS

Official Communication issued in International Patent Application No. PCT/JP2014/055378, mailed on Jun. 10, 2014.

*Primary Examiner* — Ida M Soward
(74) *Attorney, Agent, or Firm* — Keating & Bennett, LLP

(57) ABSTRACT

A semiconductor device (100T, 100B) includes: a substrate (30); a first metal layer (10) supported on the substrate (30), the first metal layer (10) including a plurality of first wires (12); an insulating layer (70) provided on the first metal layer (10); a second metal layer (20) provided on the insulating layer (70), the second metal layer (20) including a plurality of second wires (22); an insulative protection layer (80) covering part of each of the plurality of second wires (22), and an electrically-conductive layer (90) provided on the insulative protection layer (80). In a cross section including a boundary between a first region (R1) in which the insulative protection layer (80) is provided and a second region (R2) in which the insulative protection layer (80) is not provided, a surface of the insulating layer (70) which is on the insulative protection layer (80) side has a step between two of the second wires which adjoin each other.

8 Claims, 21 Drawing Sheets

(52) U.S. Cl.
CPC ........ *H01L 27/1259* (2013.01); *H01L 23/522* (2013.01); *H01L 2924/0002* (2013.01)

(56) References Cited

U.S. PATENT DOCUMENTS

| | | | | |
|---|---|---|---|---|
| 2006/0028606 A1* | 2/2006 | Takeguchi | ............ | H01L 27/124 349/149 |
| 2009/0147165 A1* | 6/2009 | Kim | ............ | H01L 27/124 349/39 |
| 2010/0002173 A1* | 1/2010 | Otani | ............ | G02F 1/133555 349/114 |
| 2010/0244037 A1* | 9/2010 | Shiota | ............ | G02F 1/1368 257/72 |
| 2011/0175086 A1* | 7/2011 | Katoh | ............ | H01L 27/14643 257/53 |
| 2011/0248377 A1* | 10/2011 | Kakehata | ............ | H01L 21/2007 257/506 |
| 2012/0068182 A1* | 3/2012 | Yamanaka | ............ | H01L 21/268 257/59 |
| 2012/0138922 A1 | 6/2012 | Yamazaki et al. | | |
| 2012/0314148 A1* | 12/2012 | Yamaguchi | ......... | H01L 51/5246 349/42 |
| 2014/0124785 A1* | 5/2014 | Tada | ............ | H01L 27/1266 257/59 |
| 2014/0176886 A1 | 6/2014 | Yoshida | | |
| 2016/0012771 A1* | 1/2016 | Kimura | ............ | G09G 3/3233 345/215 |

FOREIGN PATENT DOCUMENTS

| | | |
|---|---|---|
| JP | 2002-303889 A | 10/2002 |
| JP | 2002-351354 A | 12/2002 |
| JP | 2009-128761 A | 6/2009 |
| JP | 2012-134475 A | 7/2012 |
| WO | 2013/021866 A1 | 2/2013 |
| WO | 2014/061531 A1 | 4/2014 |

* cited by examiner (a)

(b)

(c)

(a)

(b)

(a)

(b)

(a)

(b)

(a)

(b)

(a)

(b)

(a)

(b)

(a)

(b)

(a)

(b)

(a)

(b)

(a)

(b)

(c)

(a)

(b)

(c)

SEMICONDUCTOR DEVICE INCLUDING SUBSTRATE WHICH IS USED IN DISPLAY DEVICES

TECHNICAL FIELD

The present invention relates to a semiconductor device and a semiconductor device manufacturing method and, for example, to an active matrix substrate which has TFTs and a display device which employs an active matrix substrate.

BACKGROUND ART

Display devices which have an active matrix substrate in which a switching element is provided for each pixel, such as liquid crystal display devices, have been widely used. An active matrix substrate which includes thin film transistors (hereinafter, "TFT(s)") as the switching elements is referred to as a TFT substrate. A TFT substrate for use in a liquid crystal display device includes, for example, a glass substrate, a plurality of TFTs supported on the glass substrate, a plurality of gate wires and a plurality of source wires, and a plurality of pixel electrodes in a matrix arrangement. The plurality of gate wires are arranged so as to extend in, for example, a row direction of the display plane. The plurality of source wires are arranged so as to extend in, for example, a column direction of the display plane. The gate electrode, source electrode, and drain electrode of each TFT are electrically coupled to a gate wire, a source wire, and a pixel electrode, respectively.

Liquid crystal display devices are known which have such a configuration that pixel electrodes are arranged on an insulating film that covers TFTs, gate wires, and source wires, wherein the pixel aperture ratio is improved by adjusting the thickness and/or dielectric constant of the insulating film and reducing a parasitic capacitance formed by overlap of an edge portion of the pixel electrode with the gate wires and/or the source wires (for example, Patent Documents 1 to 4). In such a liquid crystal display device, the insulating film is typically made of an organic insulative material. This is because organic insulative materials advantageously have lower dielectric constants and/or are better for formation of a thick film than inorganic insulative materials.

However, formation of a relatively-thick insulating film leads to the following problems.

A display region which is formed by the pixels that are in a matrix arrangement on the TFT substrate is surrounded by a non-display region (which is referred to as "frame region"). In some cases, terminal portions and even a driving circuit portion are provided in the frame region in addition to a seal portion that is for adhering together two substrates (TFT substrate and counter substrate) which are arranged so as to oppose each other via a liquid crystal layer. In such a configuration, the insulating film is provided over generally the entirety of the display region but is not provided at least over the terminal portions of the frame region. Thus, over the TFT substrate, there are a region in which the insulating film is provided and a region in which the insulating film is not provided. If the insulating film is thick, a relatively-large step is formed.

Accordingly, in the process of forming a pixel electrode by patterning an electrically-conductive film deposited on the insulating film, part of the electrically-conductive film remains near the edge of the insulating film so that a short circuit can sometimes occur between wires (gate wires and/or source wires) which adjoin each other. This is attributed to the fact that the thickness of a resist mask used for patterning of the electrically-conductive film is greater on the bottom side of the step of the insulating film than on the top side so that the resist mask remains. A portion of the resist mask which is thus remaining although it should have been removed after development is referred to as "resist residue".

Patent Documents 1 and 2 disclose that the pattern of the insulating film has a portion extending between wires in the frame region such that occurrence of a resist residue in the vicinity of the edge of the insulating film is suppressed. Patent Documents 3 and 4 suggest that the edge of the insulating film is configured so as not to have a steep slope angle such that occurrence of a resist residue in the vicinity of the edge of the insulating film is suppressed.

CITATION LIST

Patent Literature

Patent Document 1: Japanese Laid-Open Patent Publication No. 11-024101
Patent Document 2: Japanese Laid-Open Patent Publication No. 2002-303889
Patent Document 3: Japanese Laid-Open Patent Publication No. 11-153809
Patent Document 4: Japanese Laid-Open Patent Publication No. 2009-128761

SUMMARY OF INVENTION

Technical Problem

However, the techniques disclosed in Patent Documents 1 to 4 require precisely controlling the pattern of the insulating film or the slope angle of the edge portion of the insulating film, and therefore, there is a probability of decrease of the mass productivity, such as decrease of the process margin, decrease of the yield, and the like.

The present invention was conceived for the purpose of solving the above problems. An object of the present invention is to provide a semiconductor device in which a short circuit between wires in the frame region is suppressed although it has a simpler configuration than conventional devices or can be manufactured through a simpler process than conventional ones.

Solution to Problem

A semiconductor device according to an embodiment of the present invention includes: a substrate; a first metal layer supported on the substrate, the first metal layer including a plurality of first wires; an insulating layer provided on the first metal layer; a second metal layer provided on the insulating layer, the second metal layer including a plurality of second wires; an insulative protection layer covering part of each of the plurality of second wires, the insulative protection layer being arranged to define on the substrate a first region in which the insulative protection layer is provided and a second region in which the insulative protection layer is not provided; and an electrically-conductive layer provided on the insulative protection layer, wherein in a cross section including a boundary between the first region and the second region, a surface of the insulating layer which is on the insulative protection layer side has a step between two of the second wires which adjoin each other.

In one embodiment, the surface includes a portion protruding toward the insulative protection layer side.

In one embodiment, the protruding portion is provided at a position overlapping at least one of the two second wires.

In one embodiment, the number of steps which are present between the two second wires is one.

In one embodiment, the protruding portion is provided between the two second wires.

In one embodiment, the first metal layer includes an island portion lying in both the first region and the second region, and the step has a shape in which a contour of the island portion in the cross section is reflected.

In one embodiment, the island portion is provided at a position overlapping at least one of the two second wires.

In one embodiment, the island portion is provided between the two second wires.

The semiconductor device according to one embodiment further includes a plurality of switching elements supported on the substrate, wherein each of the plurality of switching elements includes a first contact region, a second contact region, and a channel region lying between the first contact region and the second contact region, each of the plurality of first wires is arranged so as to overlap the channel region of a corresponding one of the plurality of switching elements, and the island portion is electrically coupled with a corresponding one of the plurality of first wires.

In one embodiment, the semiconductor layer includes an oxide semiconductor. The oxide semiconductor can include an In—Ga—Zn—O based semiconductor. The In—Ga—Zn—O based semiconductor can include a crystalline portion.

In one embodiment, the semiconductor device further includes a driving circuit placed in the second region wherein the plurality of second wires include a second wire directly connected to the driving circuit.

In one embodiment, the insulative protection layer is a layer which is made of an organic insulative material.

A semiconductor device manufacturing method according to an embodiment of the present invention includes: (a) forming a first metal layer on a substrate, the first metal layer including a plurality of island portions and a plurality of first wires; (b) forming an insulating layer so as to cover the first metal layer; (c) forming a second metal layer on the insulating layer, the second metal layer including a plurality of second wires; (d) applying an insulative material on the insulating layer and on the second metal layer; (e) curing the insulative material and thereafter patterning the cured insulative material, thereby forming an insulative protection layer so as to cover part of each of the plurality of second wires and have an overlap with part of each of the plurality of island portions; and (f) forming an electrically-conductive layer on the insulative protection layer, wherein step (b) includes forming in a surface of the insulating layer a step in which a shape of the plurality of island portions is reflected.

In one embodiment, step (d) includes applying a liquid insulative material on the insulating layer and on the second metal layer.

In one embodiment, step (d) includes applying an organic insulative material on the insulating layer and on the second metal layer.

Advantageous Effects of Invention

According to an embodiment of the present invention, a semiconductor device in which a short circuit between wires in the frame region is suppressed and a semiconductor device manufacturing method are provided.

DESCRIPTION OF EMBODIMENTS

Hereinafter, a semiconductor device and a manufacturing method thereof according to an embodiment of the present invention will be described with reference to the drawings. Note that the present invention is not limited to illustrated embodiments.

(Semiconductor Device)

A semiconductor device according to an embodiment of the present invention includes: a substrate; a first metal layer supported on the substrate, the first metal layer including a plurality of first wires; an insulating layer provided on the first metal layer; a second metal layer provided on the insulating layer, the second metal layer including a plurality of second wires; an insulative protection layer covering part of each of the plurality of second wires; and an electrically-conductive layer provided on the insulative protection layer. The insulative protection layer defines, on the substrate, a first region in which the insulative protection layer is provided and a second region in which the insulative protection layer is not provided. In a cross section including a boundary between the first region and the second region, a surface of the insulating layer which is on the insulative protection layer side has a step between two of the second wires which adjoin each other. Since in a cross section including a boundary between the first region and the second region a surface of the insulating layer which is on the insulative protection layer side has a step between two of the second wires which adjoin each other, formation of a leakage path between the two adjoining second wires is suppressed. Note that, in this specification, the "metal layer" means a layer which has electrical conductivity, and is not limited to a layer which is made of a metal but includes, for example, a layer which is made of a metal nitride or a metal oxide. Further, the "metal layer" is not limited to a single layer but may consist of a plurality of stacked layers. Hereinafter, a TFT substrate which is to be used as a semiconductor device in a liquid crystal display device is described as an example.

Figure 1:
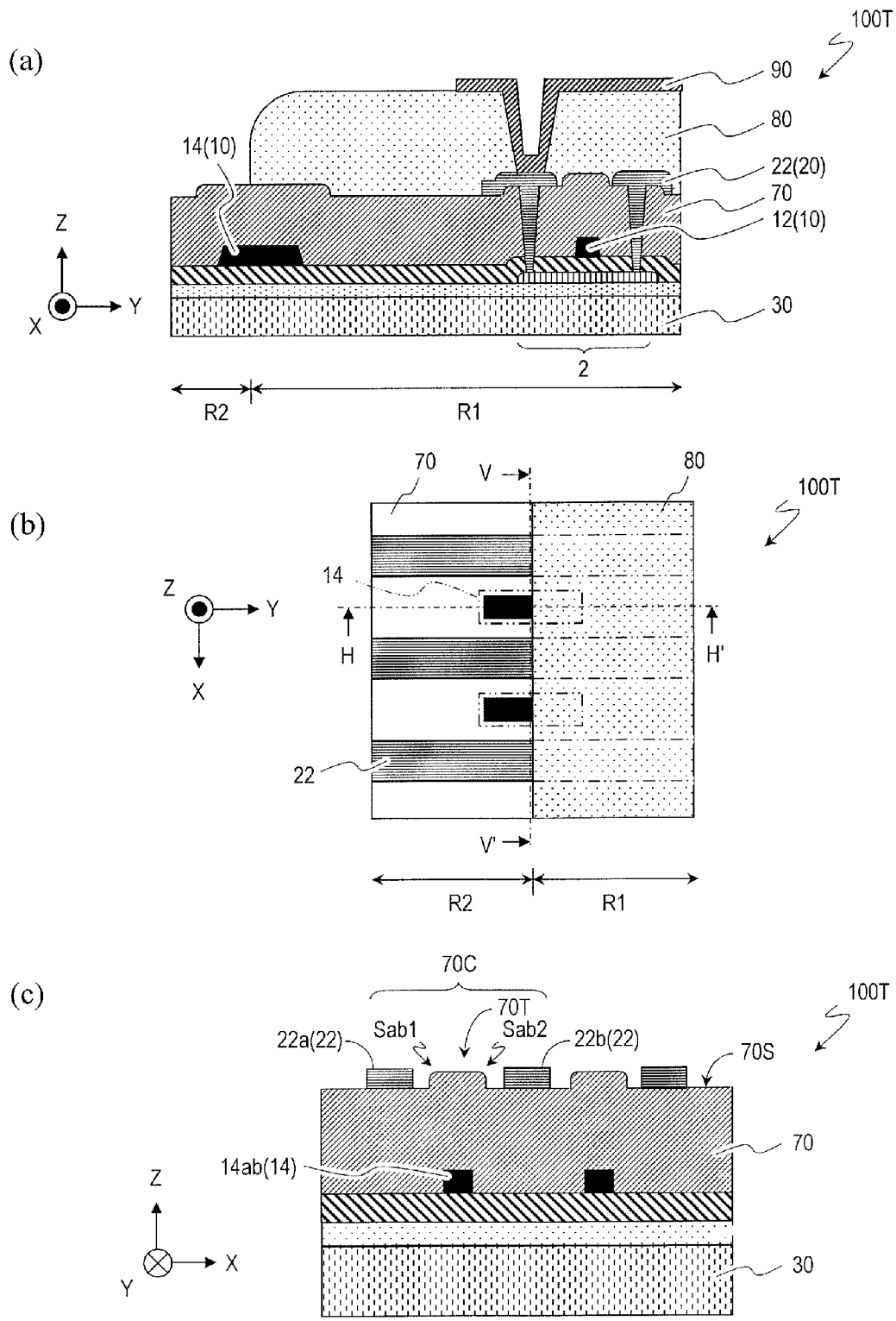
FIG. 1 (a) is a schematic cross-sectional view of a TFT substrate 100T according to an embodiment of the present invention. (b) is a top view of the TFT substrate 100T. (c) is a diagram showing a cross section of the TFT substrate 100T which includes the boundary between the first region R1 and the second region R2.

First, the general configuration of a TFT substrate according to an embodiment of the present invention will be described with reference to FIGS. 1(a) to 1(c). And subsequently, the reasons why in the TFT substrate according to an embodiment of the present invention a short circuit between two adjoining wires (typically, source wires) stretched into the second region is suppressed will be described with reference to FIGS. 2(a) to 2(c).

FIG. 1(a) is a schematic cross-sectional view of a TFT substrate 100T according to an embodiment of the present invention. FIG. 1(b) is a top view of the TFT substrate 100T. FIG. 1(a) corresponds to a cross-sectional view of the TFT substrate 100T taken along line H-H' of FIG. 1(b). In FIG. 1(a) and FIG. 1(b), the X axis, Y axis and Z axis, which are orthogonal to one another, are illustrated for the sake of comparison. The X axis and the Y axis represent, for example, the horizontal direction and the vertical direction, respectively, of the display plane of the liquid crystal display device. The Z axis represents, for example, a direction from the TFT substrate to the counter substrate in the liquid crystal display device. Note that, also in some of the other drawings, the X axis, Y axis and Z axis are illustrated for the sake of comparison.

As shown in FIG. 1(a), the TFT substrate 100T includes a substrate 30 and a first metal layer 10 supported on the substrate 30, the first metal layer 10 including a plurality of first wires (typically, gate wires) 12. Each of the first wires 12 includes a gate electrode which is arranged so as to overlap the channel region of a corresponding TFT 2. Details of the TFT 2 will be described later. An insulating layer 70 is provided on the first metal layer 10. A second metal layer 20 is provided on the insulating layer 70. The second metal layer 20 includes a plurality of second wires (typically, source wires) 22. An insulative protection layer 80 is provided on the second metal layer 20. The insulative protection layer 80 is, typically, a layer which is made of an organic insulative material. The insulative protection layer 80 covers part of each of the second wires 22. In other words, each of the second wires 22 has an exposed portion which is not covered with the insulative protection layer 80. On the insulative protection layer 80, an electrically-conductive layer (e.g., pixel electrode) 90 is provided.

As shown in FIG. 1(a) and FIG. 1(b), the insulative protection layer 80 covers part of each of the second wires 22, thereby defining on the substrate 30 a first region R1 in which the insulative protection layer 80 is provided and a second region R2 in which the insulative protection layer 80 is not provided. In the example illustrated in FIG. 1(a) and FIG. 1(b), the first metal layer 10 includes an island portion 14. This island portion 14 is arranged so as to lie in both the first region R1 and the second region R2.

FIG. 1(c) is a diagram showing a cross section of the TFT substrate 100T which includes the boundary between the first region R1 and the second region R2. FIG. 1(c) corresponds to a cross-sectional view of the TFT substrate 100T taken along line V-V' of FIG. 1(b). In FIG. 1(c), illustration of the insulative protection layer 80 is omitted for the sake of avoiding complexity. Note that illustration of the insulative protection layer is also omitted from some of the other cross-sectional views.

As shown in FIG. 1(c), in a cross section including the boundary between the first region R1 and the second region R2, a surface 70S of the insulating layer 70 which is on the insulative protection layer 80 side has a step (shoulder) between two second wires 22 which adjoin each other. In an example illustrated in FIG. 1(c), the surface 70S includes a portion 70C protruding toward the insulative protection layer 80 side (in FIG. 1(c), +Z direction). Hereinafter, the portion 70C is sometimes referred to as "raised portion". As a result, there are a step Sab1 and a step Sab2 between the second wire 22a and the second wire 22b. As shown in FIG. 1(c), the raised portion 70C is present above the island portion 14. The step Sab1 and the step Sab2 have a shape in which the contour of the island portion 14ab is reflected. Hereinafter, the upper surface of the raised portion is sometimes referred to as "top surface".

Next, refer to FIG. 2(a). FIG. 2(a) schematically shows that a material which forms an electrically-conductive layer 90 is remaining in the vicinity of the boundary between the first region R1 and the second region R2 (in the vicinity of the edge of the insulative protection layer 80). Since in the TFT substrate 100T the surface 70S of the insulating layer 70 has the steps, part Res of the material that forms the electrically-conductive layer 90 remaining in the vicinity of the edge of the insulative protection layer 80 (hereinafter, sometimes referred to as "electrically-conductive residue") is divided into a portion Res1 overlying the top surface 70T of the raised portion 70C and a portion Res2 overlying a surface which is lower than the top surface 70T. Therefore, even if the electrically-conductive residue Res is present, a short circuit between the second wires is suppressed.

FIGS. 2(b) and 2(c) show, as a comparative example, a top view and a cross-sectional view, respectively, of a TFT substrate 500 which does not have a step in the surface of an insulating layer 570. FIG. 2(c) corresponds to a cross-sectional view of the TFT substrate 500 taken along line V-V' of FIG. 2(b). As shown in FIGS. 2(b) and 2(c), in the TFT substrate 500, the surface of the insulating layer 570 does not have a step. In this case, the electrically-conductive residue Res is not divided in a space between two second wires which adjoin each other, and therefore, there is a probability that the two adjoining second wires are coupled together via the electrically-conductive residue Res. Thus, in the TFT substrate 500, there is a probability that a leakage path is formed between the two adjoining second wires in the vicinity of the edge of an insulative protection layer 580.

Next, the configuration of a semiconductor device according to an embodiment of the present invention is described in more detail with reference to FIGS. 3(a) and 3(b).

FIG. 3(a) is a schematic top view of the TFT substrate 100T. In the example illustrated in FIG. 3(a), the plurality of first wires 12 extend in the X direction (e.g., the horizontal direction of the display plane), and the plurality of second wires 22 extend in the Y direction (e.g., the vertical direction of the display plane). Each of the plurality of second wires 22 intersects with respective ones of the plurality of first wires 12 via the insulating layer 70 (not shown). In the vicinity of the intersection of the first wire 12 and the second wire 22, a TFT 2 is provided as the switching element.

As shown in FIG. 3(a), a storage capacitor wire 18 may be provided. In this case, a storage capacitor is formed at the overlap of the storage capacitor wire 18 and the electrically-conductive layer 90. As will be described later, the storage capacitor wire 18 is formed in the step of forming the plurality of first wires 12 on the substrate 30. That is, the first metal layer 10 may further have a plurality of storage capacitor wires 18.

FIG. 3(b) is a schematic cross-sectional view of the TFT substrate 100T shown in FIG. 3(a) taken along line W-W'. FIG. 3(b) shows the surroundings of the TFT 2 shown in FIG. 3(a). As shown in FIG. 3(b), the TFT 2 has a semiconductor layer 50 which includes a first contact region 51, a second contact region 52 and a channel region 54. The channel region 54 is present between the first contact region 51 and the second contact region 52.

The semiconductor layer 50 of the TFT 2 is provided on the substrate 30. The semiconductor layer 50 and the first wires 12 are insulated from each other by a gate insulating layer 60 that covers the semiconductor layer 50. Each of the plurality of first wires 12 is arranged so as to overlap the channel region 54 of a corresponding one of the plurality of TFTs 2 provided on the substrate 30. On the other hand, each of the plurality of second wires 22 is electrically coupled to the second contact region 52 of a corresponding one of the plurality of TFTs 2. This allows supply of scan signals from the first wires 12 and supply of display signals from the second wires 22 to respective ones of the plurality of TFTs 2. Note that, as shown in FIG. 3(b), a buffer layer 40 may be provided between the substrate 30 and the gate insulating layer 60.

The material of the semiconductor layer 50 may be selected from a variety of semiconductor materials. For example, the material of the semiconductor layer 50 may be selected from amorphous silicon (a-Si), polycrystalline silicon (typically, low temperature polysilicon), continuous grain silicon (CGS), etc.

The semiconductor layer 50 may be a layer which contains an oxide semiconductor. The oxide semiconductor includes, for example, an In—Ga—Zn—O based semiconductor (hereinafter, abbreviated as "In—Ga—Zn—O semiconductor"). Here, the In—Ga—Zn—O semiconductor is a ternary oxide of In (indium), Ga (gallium) and Zn (zinc). The proportion of In, Ga and Zn (mole fraction) is not particularly limited but includes, for example, In:Ga:Zn=2:2:1, In:Ga:Zn=1:1:1, In:Ga:Zn=1:1:2, and the like. In the present embodiment, the semiconductor layer 50 may be an In—Ga—Zn—O semiconductor layer which contains In, Ga and Zn in the proportion of In:Ga:Zn=1:1:1, for example.

A TFT which includes an In—Ga—Zn—O semiconductor layer has high mobility (more than 20 times that of a-Si TFT) and low current leakage (less than 1/100 of that of a-Si TFT) and is therefore suitably used as a driver TFT and a pixel TFT. Using a TFT which includes an In—Ga—Zn—O semiconductor layer enables a great reduction of the power consumption by the semiconductor device.

The In—Ga—Zn—O semiconductor may be amorphous or may include a crystalline portion so that it can have crystallinity. A preferred crystalline In—Ga—Zn—O semiconductor is a crystalline In—Ga—Zn—O semiconductor whose c-axis is oriented generally perpendicular to the layer surface. An example of the crystalline structure of such an In—Ga—Zn—O semiconductor is disclosed in Japanese Laid-Open Patent Publication No. 2012-134475. The entire disclosure of Japanese Laid-Open Patent Publication No. 2012-134475 is incorporated by reference in this specification.

The semiconductor layer 50 may include any other oxide semiconductor instead of the In—Ga—Zn—O semiconductor. For example, the semiconductor layer 50 may include a Zn—O based semiconductor (ZnO), an In—Zn—O based semiconductor (IZO (registered trademark)), a Zn—Ti—O based semiconductor (ZTO), a Cd—Ge—O based semiconductor, a Cd—Pb—O based semiconductor (CdO: cadmium oxide), a Mg—Zn—O based semiconductor, an In—Sn—Zn—O based semiconductor (e.g., $In_2O_3$—$SnO_2$—ZnO), an In—Ga—Sn—O based semiconductor, or the like.

As shown in FIG. 3(b), the second contact region 52 of the semiconductor layer 50 and the second wire 22 are electrically coupled to each other via a contact hole formed in the gate insulating layer 60 and the insulating layer 70. Likewise, the first contact region 51 of the semiconductor layer 50 and the drain electrode 21 are electrically coupled to each other via another contact hole formed in the gate insulating layer 60 and the insulating layer 70. As will be described later, the drain electrode 21 is formed in the step of forming the second wires 22. That is, the second metal layer 20 typically has a drain electrode 21 corresponding to each TFT.

The drain electrode 21 is electrically coupled to the electrically-conductive layer 90 via a contact hole vp formed in the insulative protection layer 80. When the TFT substrate 100T is a TFT substrate used in a Vertical Alignment (VA) mode liquid crystal display device, the electrically-conductive layer 90 is typically configured as a transparent electrode. Note that the TFT substrate 100T may be a TFT substrate for use in, for example, a Twisted Nematic (TN) mode, Super Twisted Nematic (STN) mode, or Optical Compensated Bend (OCB) mode liquid crystal display device. Alternatively, the TFT substrate 100T may be a TFT substrate for use in a liquid crystal display device which operates in a transverse electric field mode, such as In-Plane Switching (IPS) mode and Fringe Field Switching (FFS) mode. Thus, the electrically-conductive layer 90 may not be transparent in some cases.

(Manufacturing Method of Semiconductor Device)

Next, a manufacturing method of a semiconductor device according to an embodiment of the present invention is described with reference to FIG. 4 to FIG. 8. Here, a manufacturing method of a TFT substrate in which top gate type TFTs are provided on a substrate is described as an example. A manufacturing method of a TFT substrate in which bottom gate type TFTs are provided on a substrate will be described later.

Figure 4:
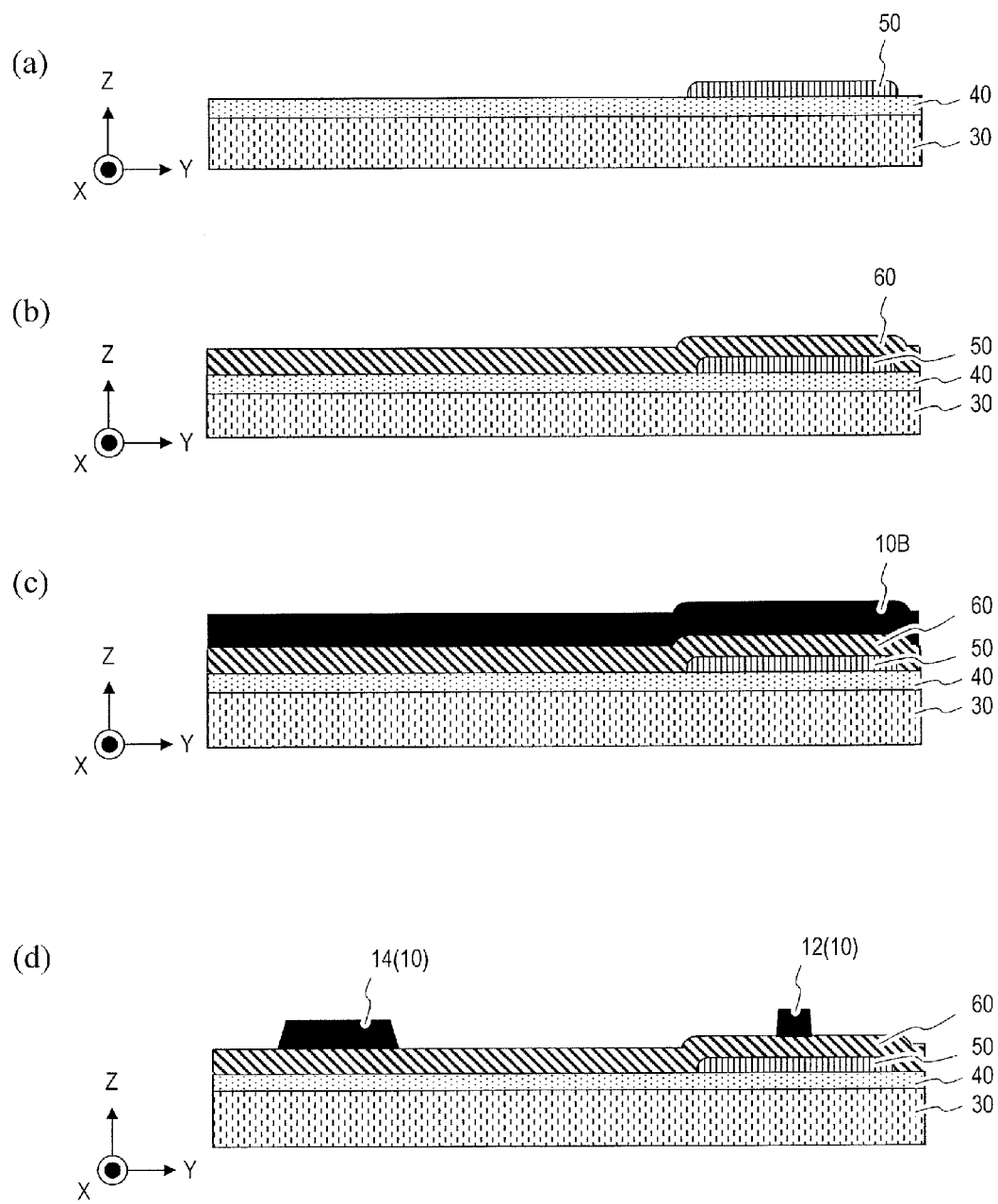
FIG. 4 (a) to (d) are schematic diagrams illustrating the general procedure of a manufacturing method of a TFT substrate according to an embodiment of the present invention.

As shown in FIG. 4(*a*), firstly, a substrate 30 (e.g., glass substrate) is provided. A buffer layer 40 may be formed on the substrate 30 beforehand. Examples of the material that forms the buffer layer 40 include $SiO_2$ and SiN. The buffer layer 40 may be a multilayer structure of $SiO_2$ and SiNO. The buffer layer 40 can be formed by, for example, CVD (Chemical Vapor Deposition). The thickness of the buffer layer 40 is, for example, from 100 nm to 400 nm.

Then, a semiconductor layer 50 is formed on the substrate 30. For example, when continuous grain silicon is used as the material of the semiconductor layer 50, a silicon film is formed on the substrate 30 by CVD. At this point in time, the thickness of the silicon film is, for example, from 30 nm to 100 nm. After crystallization of the silicon film, a photoresist layer is formed by photolithography so as to cover a predetermined region of the silicon film. Then, part of the silicon film which is not covered with the photoresist layer is removed by dry etching.

Then, as shown in FIG. 4(*b*), a gate insulating layer 60 is formed so as to cover the entire surface of the substrate 30. Examples of the material that forms the gate insulating layer 60 include $SiO_2$ and SiNx. The gate insulating layer 60 may be a multilayer structure of $SiO_2$ and SiNx. The gate insulating layer 60 can be formed by, for example, CVD. The thickness of the gate insulating layer 60 is, for example, from 50 nm to 200 nm.

Then, as shown in FIG. 4(*c*), a metal film (electrical conductor film) 10B is formed on the gate insulating layer 60 by sputtering. Examples of the material that forms the metal film 10B include W, Ta, TaN, Mo, MoW, Ti, and Al. The metal film 10B may be a multilayer film consisting of two or more of these material examples. The thickness of the metal film 10B is, for example, from 200 nm to 500 nm.

Figure 3:
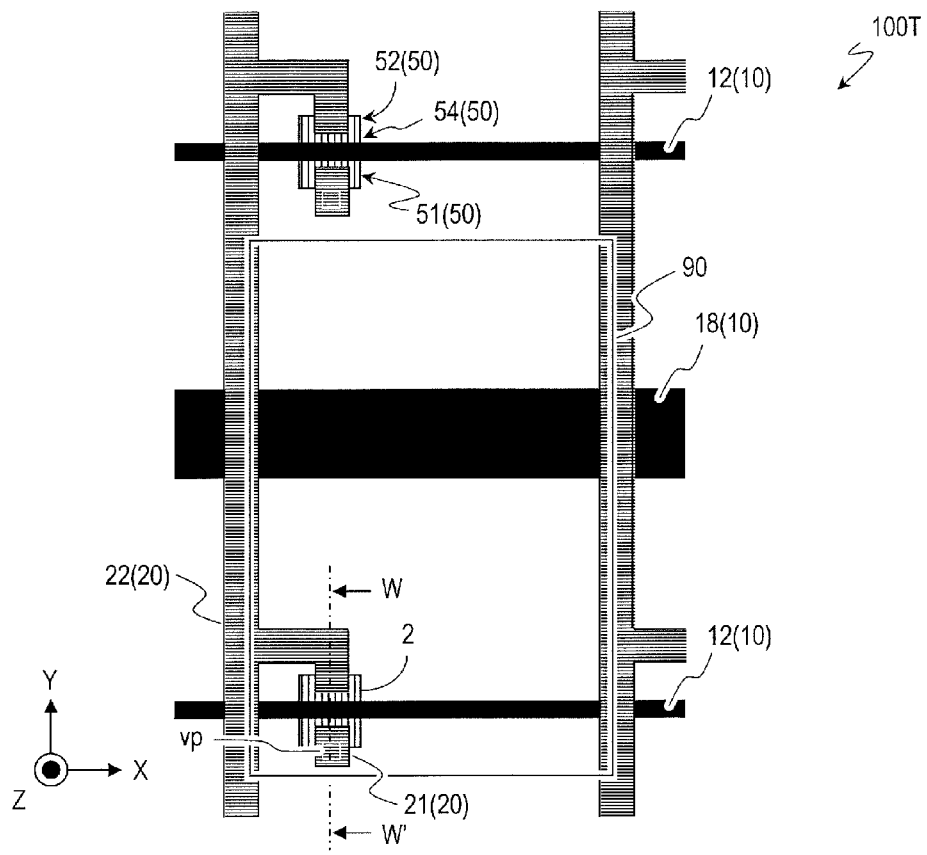
FIG. 3 (a) is a schematic top view of the TFT substrate 100T. (b) is a cross-sectional view showing the surroundings of a TFT 2 shown in (a).
Figure 3:
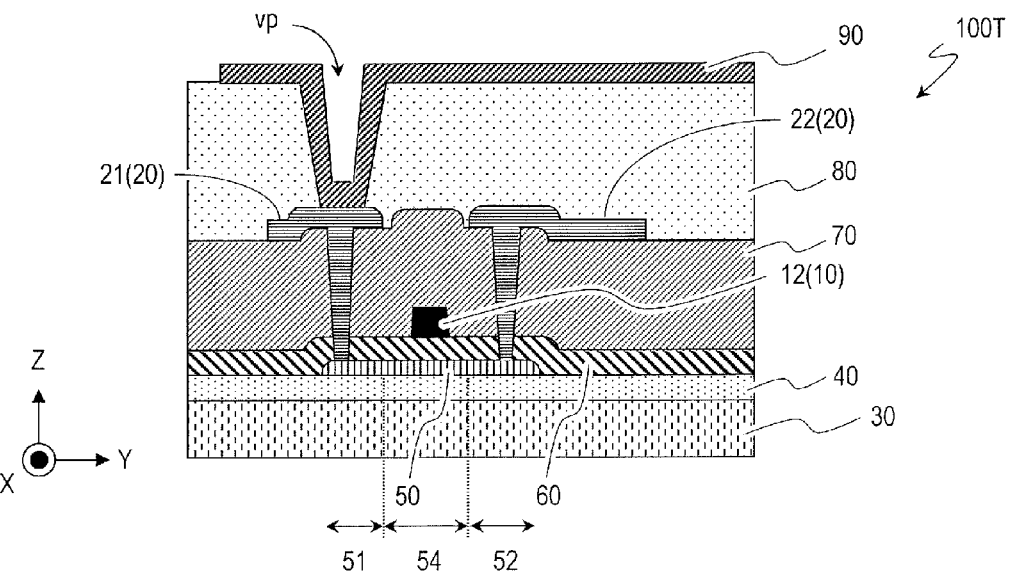

A resist is applied over the metal film 10B, and thereafter, patterning is carried out by photolithography. Thereafter, part of the metal film 10B which is not covered with the resist is removed by dry etching or wet etching, whereby a plurality of first wires 12 and a plurality of island portions 14 are formed on the gate insulating layer 60 (see FIG. 4(*d*)). A storage capacitor wire 18 such as shown in FIG. 3(*a*) may be formed together with the plurality of first wires 12 and the plurality of island portions 14. In this way, the first metal layer 10 that has the plurality of first wires 12 and the plurality of island portions 14 is obtained. Note that the island portions 14 are formed so as to lie in both a region which is to be the first region R1 and a region which is to be the second region R2.

Figure 5:
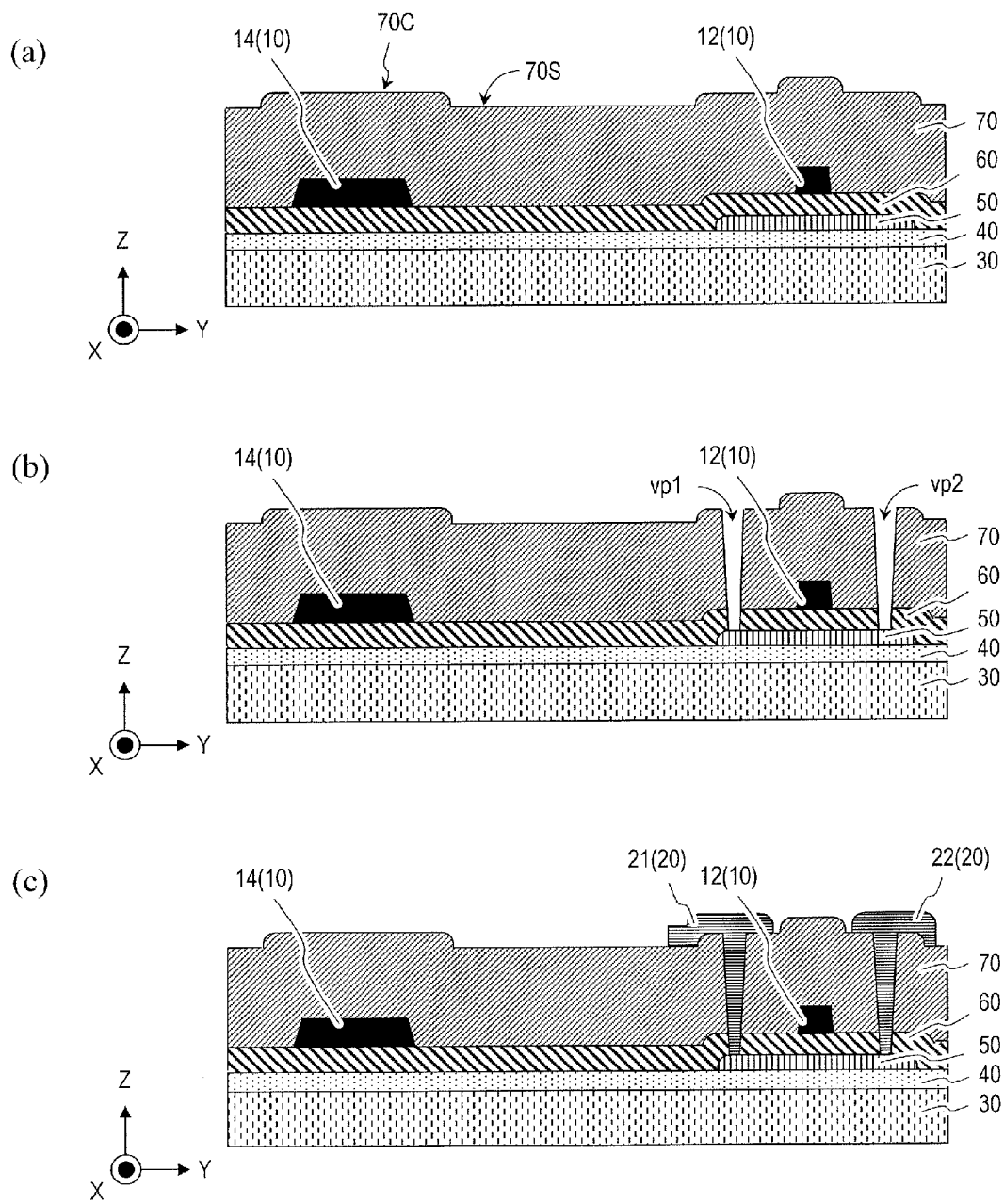
FIG. 5 (a) to (c) are schematic diagrams illustrating the general procedure of a manufacturing method of a TFT substrate according to an embodiment of the present invention.

Then, as shown in FIG. 5(*a*), an insulating layer 70 is formed so as to cover the entire surface of the first metal layer 10. Examples of the material that forms the insulating layer 70 include $SiO_2$, SiNx and SiNxOy. The insulating layer 70 may be a multilayer film consisting of two or more of these material examples. The insulating layer 70 can be formed by, for example, CVD. The thickness of the insulating layer 70 is, for example, from 300 nm to 1000 nm.

Here, the insulating layer 70 has a raised portion 70C as shown in FIG. 5(*a*). In the process of forming the insulating layer 70, the material that is to form the insulating layer 70 is deposited on the upper surface of the gate insulating layer 60 and the upper surface of the island portion 14. Therefore, the shape of the island portion 14 is reflected in the shape of the raised portion 70C. In other words, in the process of forming the insulating layer 70, a step in which the shape of the island portion 14 is reflected is formed in the surface 70S of the insulating layer 70.

Next, a resist is applied over the insulating layer 70, and thereafter, patterning is carried out by photolithography. Thereafter, contact holes vp1 and vp2 are formed in the gate insulating layer 60 and the insulating layer 70 by dry etching or wet etching (see FIG. 5(*b*)).

Then, a second metal layer 20 including a plurality of second wires 22 is formed on the insulating layer 70 in the same way as the first metal layer (see FIG. 5(*c*)). More specifically, a metal film (electrical conductor film) is formed on the insulating layer 70 by sputtering or the like and then patterned by photolithography or etching. Examples of the metal film include a Ti/Al (upper layer/lower layer) multilayer film, a Ti/Al/Ti multilayer film, a TiN/Al/TiN multilayer film, a Mo/Al—Nd/Mo multilayer film, and Mo/Al/Mo. The thickness of the metal film is, for example, from 100 nm to 500 nm. Note that a drain electrode 21 is formed together with formation of the second wire 22. The drain electrode 21 is electrically coupled with the first contact region of the semiconductor layer 50 via the contact hole vp1. The second wires 22 is electrically coupled with the second contact region of the semiconductor layer 50 via the contact hole vp2.

Figure 6:
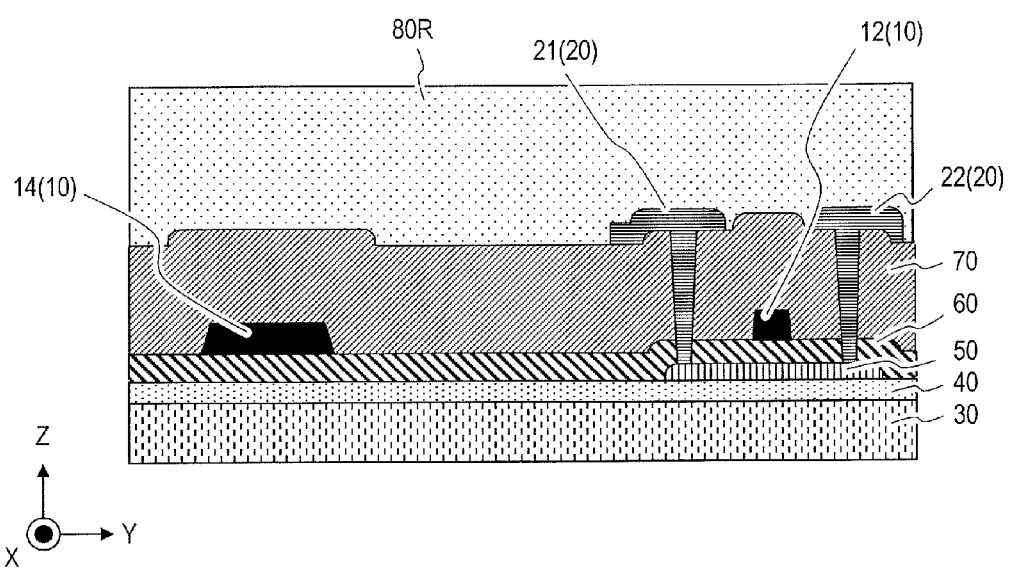
FIGS. 6 (a) and (b) are schematic diagrams illustrating the general procedure of a manufacturing method of a TFT substrate according to an embodiment of the present invention.
Figure 6:
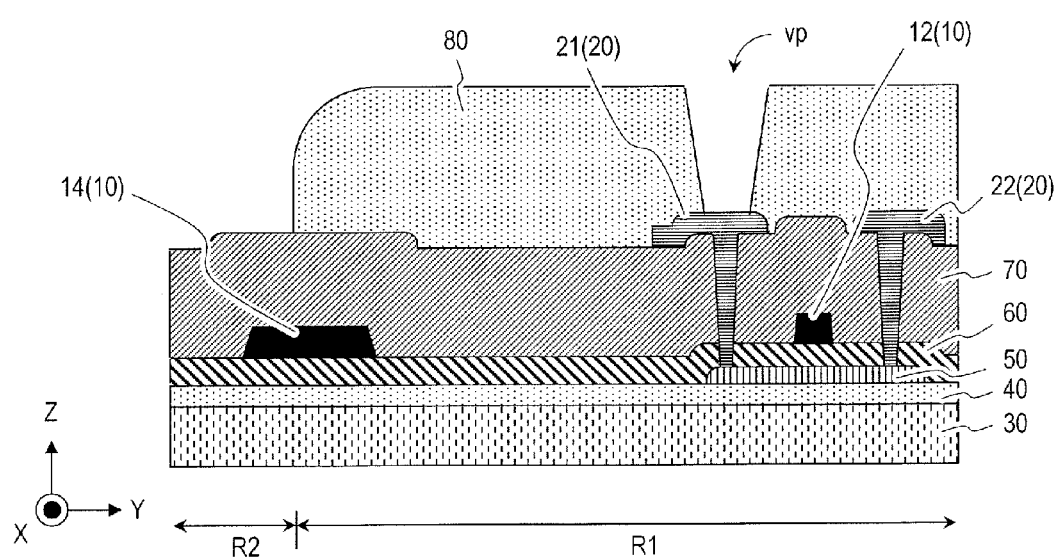

Then, as shown in FIG. 6(*a*), an insulative material 80R is applied over the insulating layer 70 and the second metal layer 20. The insulative material 80R is typically a liquid insulative material. For example, an organic insulative material (typically, a photosensitive resin) is applied over the insulating layer 70 and the second metal layer 20. A Spin on Glass material may be applied over the insulating layer 70 and the second metal layer 20.

Then, photolithography is carried out for curing and patterning of the insulative material 80R, whereby an insulative protection layer 80 is formed (see FIG. 6(*b*)). The thickness of the insulative protection layer 80 is, for example, from 1 µm to 3 µm. Note that a contact hole vp is formed by patterning in a portion overlapping the drain electrode 21.

The insulative protection layer 80 covers substantially the entire surface of the display region. Thereby, the first region R1 (a region in which the insulative protection layer 80 is provided) and the second region R2 (a region in which the insulative protection layer 80 is not provided) are defined on the substrate. Typically, each of the plurality of second wires 22 extends from the display region to the frame region. Therefore, the insulative protection layer 80 covers part of each of the plurality of second wires 22 (see FIG. 1(*b*)). Further, as shown in FIG. 6(*b*), the insulative protection layer 80 has an overlap with part of each of the plurality of island portions 14. Thus, in a cross section including the boundary between the first region R1 and the second region R2, a step is formed in a surface of the insulating layer 70 which is on the insulative protection layer 80 side. Note that the boundary between the first region R1 and the second region R2 is not limited to a linear boundary but may be a curved boundary.

Figure 7:
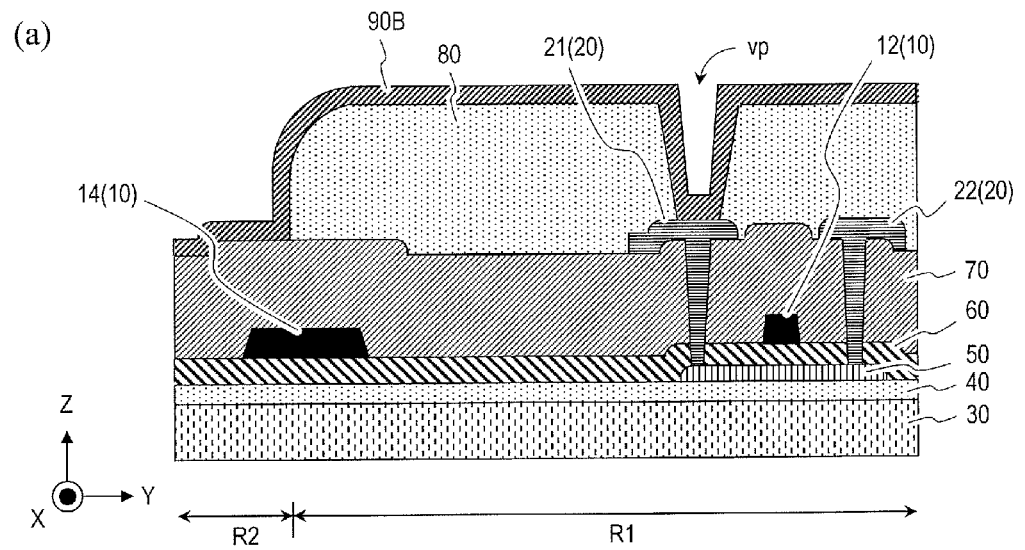
FIGS. 7 (a) and (b) are schematic diagrams illustrating the general procedure of a manufacturing method of a TFT substrate according to an embodiment of the present invention.
Figure 7:
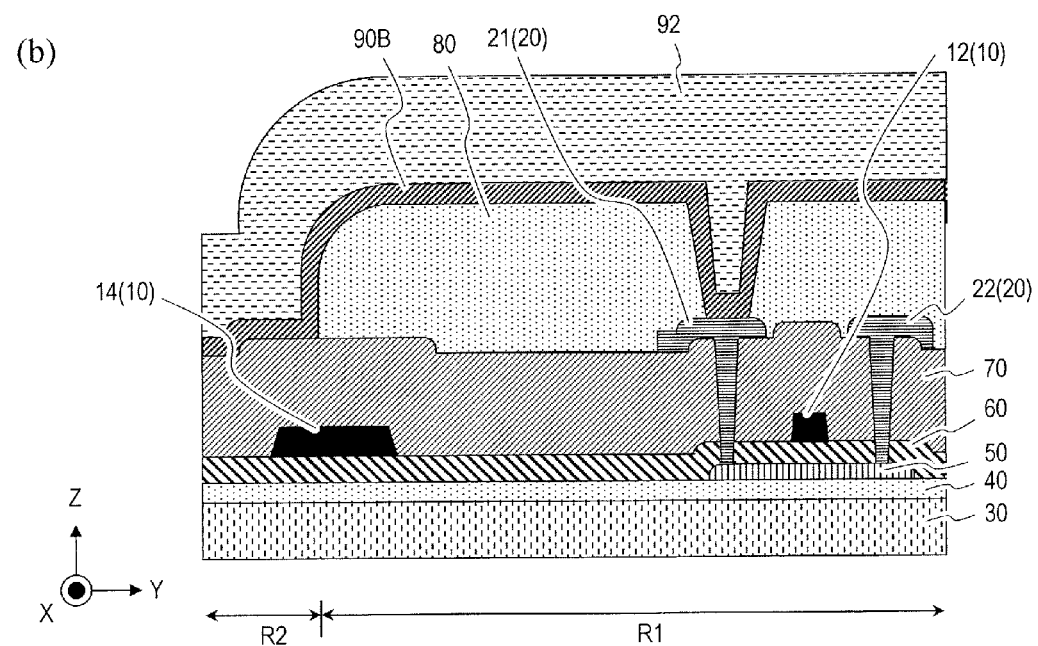

Then, as shown in FIG. 7(*a*), an electrode film 90B is formed on the insulative protection layer 80 by sputtering or the like. Examples of the material that forms the electrode film 90B include ITO, IZO, and ZnO. The thickness of the electrode film 90B is, for example, from 30 nm to 150 nm. The electrode film 90B is also formed on the bottom surface of the contact hole vp (the upper surface of the drain electrode 21) and on the inner lateral surface of the contact hole vp.

Figure 8:
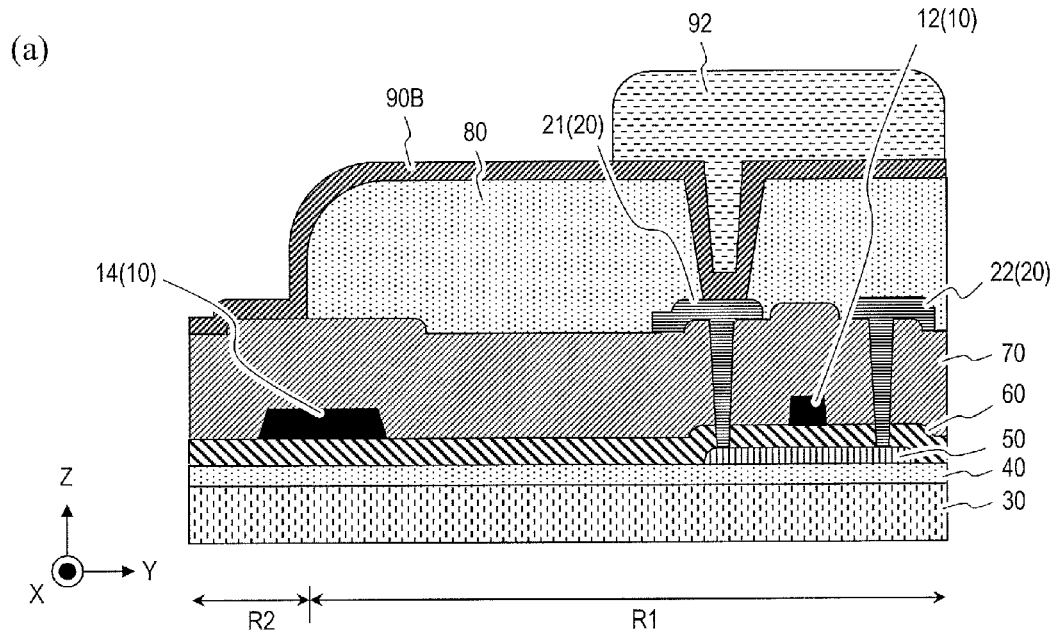
FIGS. 8 (a) and (b) are schematic diagrams illustrating the general procedure of a manufacturing method of a TFT substrate according to an embodiment of the present invention.
Figure 8:
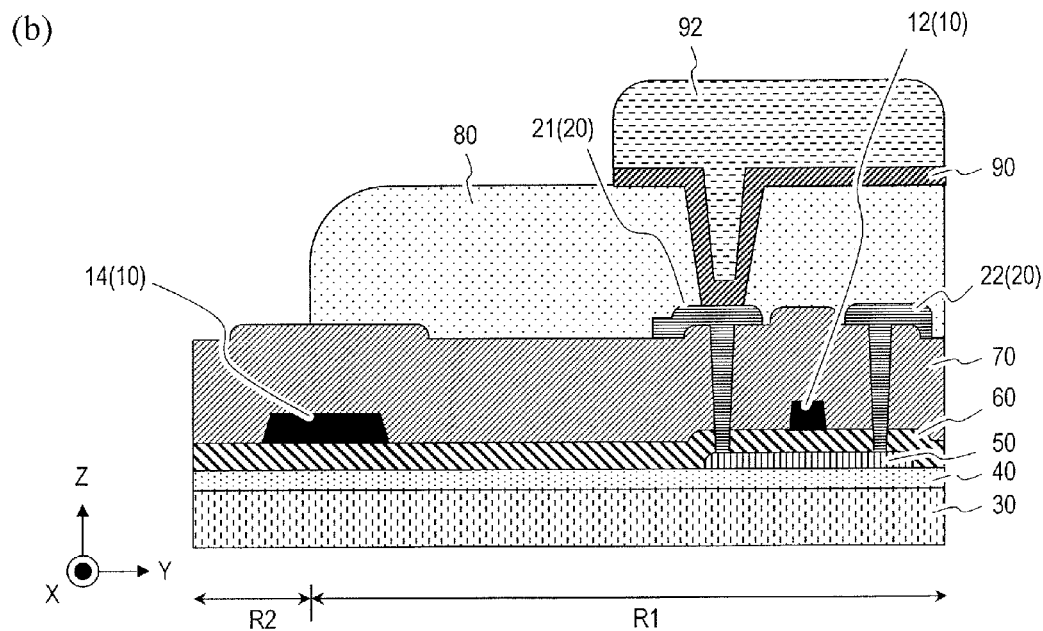

Then, a resist 92 is applied over the electrode film 90B (see FIG. 7(*b*)) and then patterned by photolithography (see FIG. 8(*a*)). Thereafter, part of the electrode film 90B which is not covered with the resist 92 is removed by wet etching, whereby the electrically-conductive layer 90 is formed on the insulative protection layer 80 (see FIG. 8(*b*)). After the wet etching, the resist 92 is removed, whereby a TFT substrate 100T according to an embodiment of the present invention is obtained.

As seen from the above-described example of the manufacturing process, according to an embodiment of the present invention, a plurality of island portions are formed in the process of forming a plurality of first wires (typically, gate wires). That is, a semiconductor device in which a short circuit between second wires (typically, source wires) in the frame region is suppressed can be manufactured without largely changing existing manufacturing processes.

Figure 9:
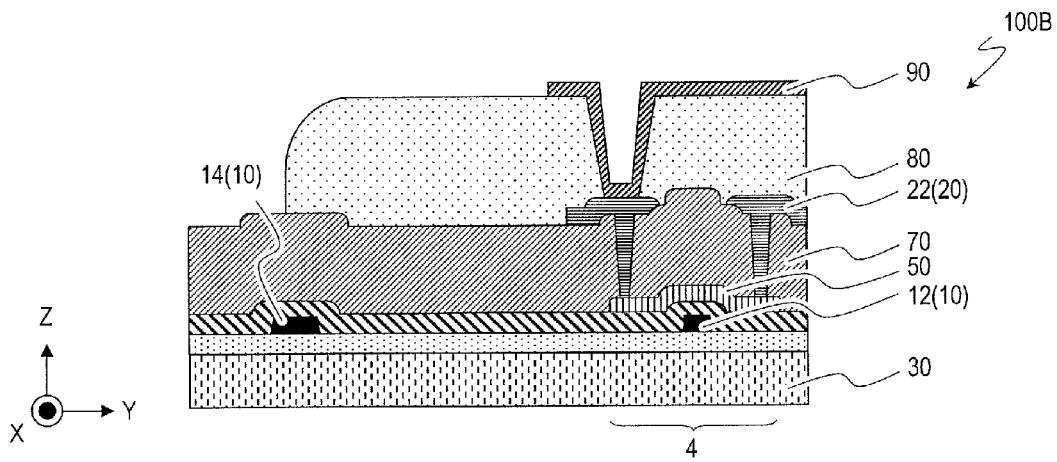
FIG. 9 A schematic cross-sectional view of a TFT substrate 100B in which a bottom gate type TFT 4 is provided on a substrate 30.

In the foregoing, the manufacturing method of a TFT substrate in which top gate type TFTs are provided on a substrate has been described as an example. However, the TFTs provided on the substrate are not limited to the top gate type. The TFTs provided on the substrate may be bottom gate type TFTs. FIG. 9 shows a schematic cross section of a TFT substrate 100B in which a bottom gate type TFT 4 is provided on a substrate 30.

Hereinafter, a manufacturing method of a TFT substrate in which bottom gate type TFTs are provided is described with reference to FIG. 10 to FIG. 13.

Figure 10:
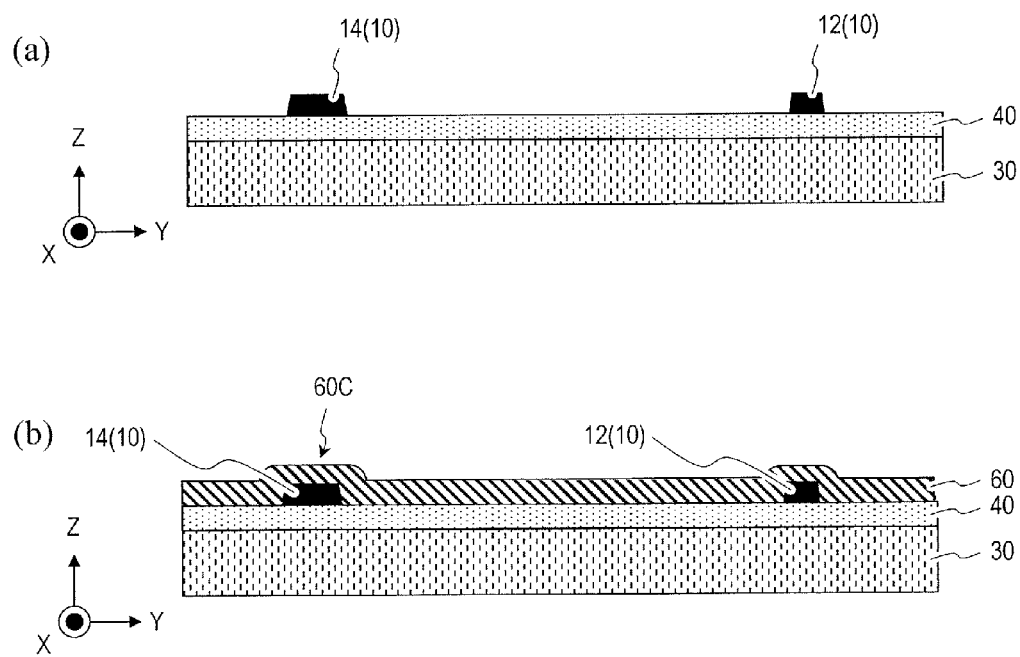
FIGS. 10 (a) and (b) are schematic diagrams illustrating the general procedure of a manufacturing method of a TFT substrate in which a bottom gate type TFT is provided.

Firstly, a metal film is formed on the substrate 30, and the formed metal film is patterned, whereby a first metal film 10 which has a plurality of first wires 12 and a plurality of island portions 14 is formed on the substrate 30 (see FIG. 10(*a*)). The island portions 14 are formed so as to lie in both a region which is to be the first region R1 and a region which is to be the second region R2. A buffer layer 40 may be formed on the substrate 30 beforehand.

Then, as shown in FIG. 10(*b*), a gate insulating layer 60 is formed by, for example, CVD so as to cover the substrate 30 and the first metal layer 10. In the process of forming the gate insulating layer 60, the material that is to form the gate insulating layer 60 is deposited on the upper surface of the substrate 30 (or the buffer layer 40) and the upper surface of the island portion 14. Therefore, the gate insulating layer 60 has a raised portion 60C in which the shape of the island portion 14 is reflected.

Figure 11:
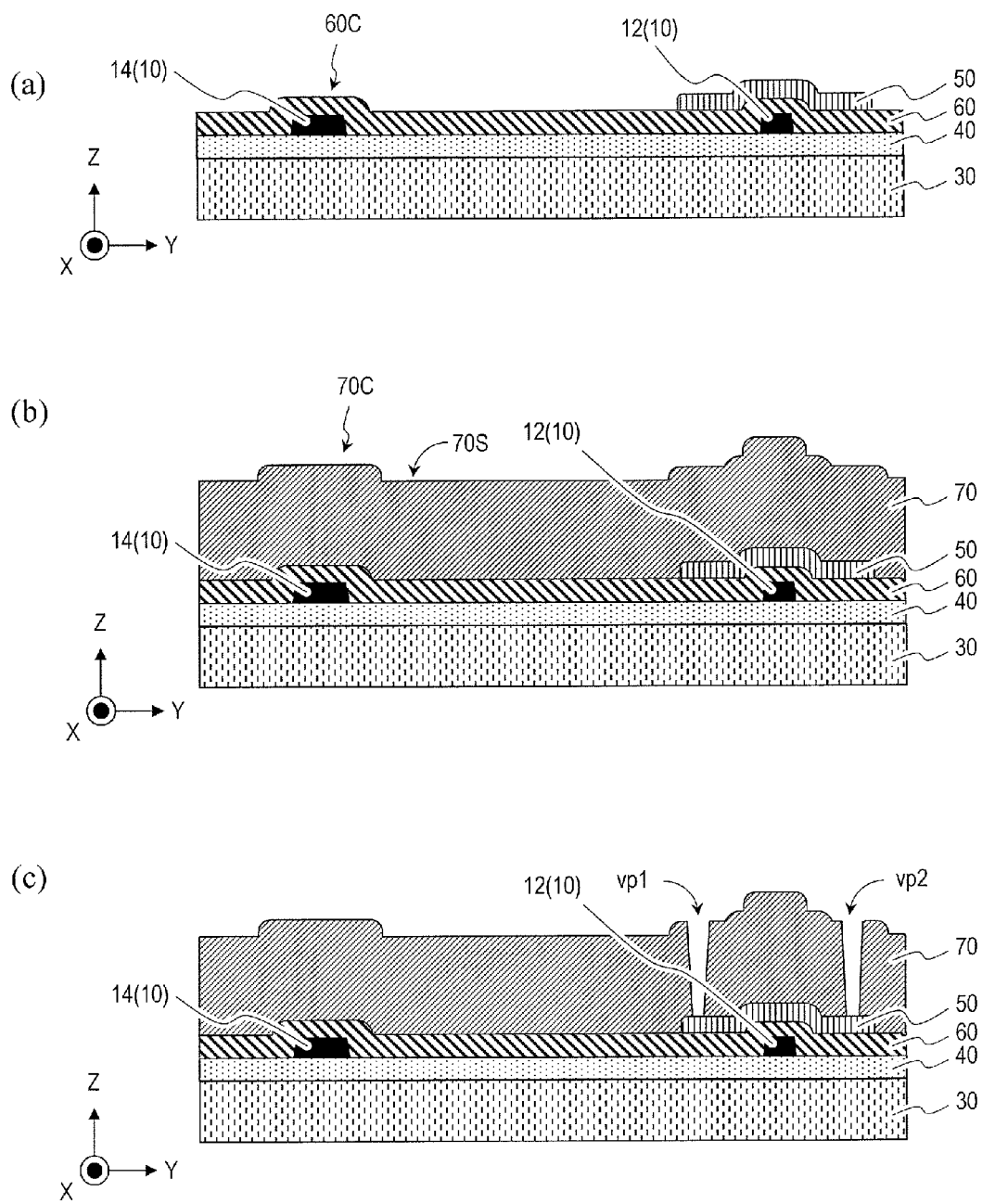
FIG. 11 (a) to (c) are schematic diagrams illustrating the general procedure of a manufacturing method of a TFT substrate in which a bottom gate type TFT is provided.
Figure 12:
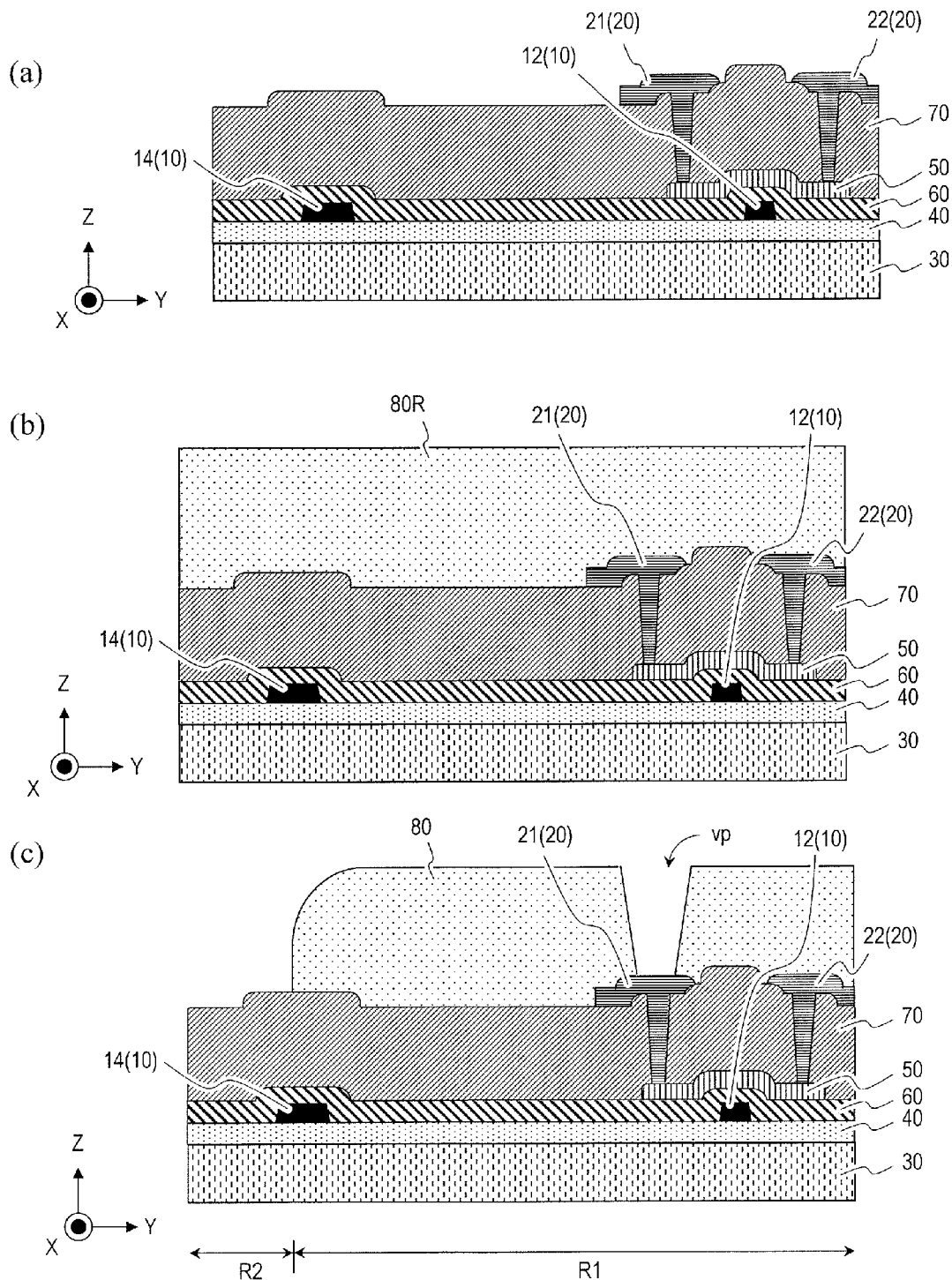
FIG. 12 (a) to (c) are schematic diagrams illustrating the general procedure of a manufacturing method of a TFT substrate in which a bottom gate type TFT is provided.
Figure 13:
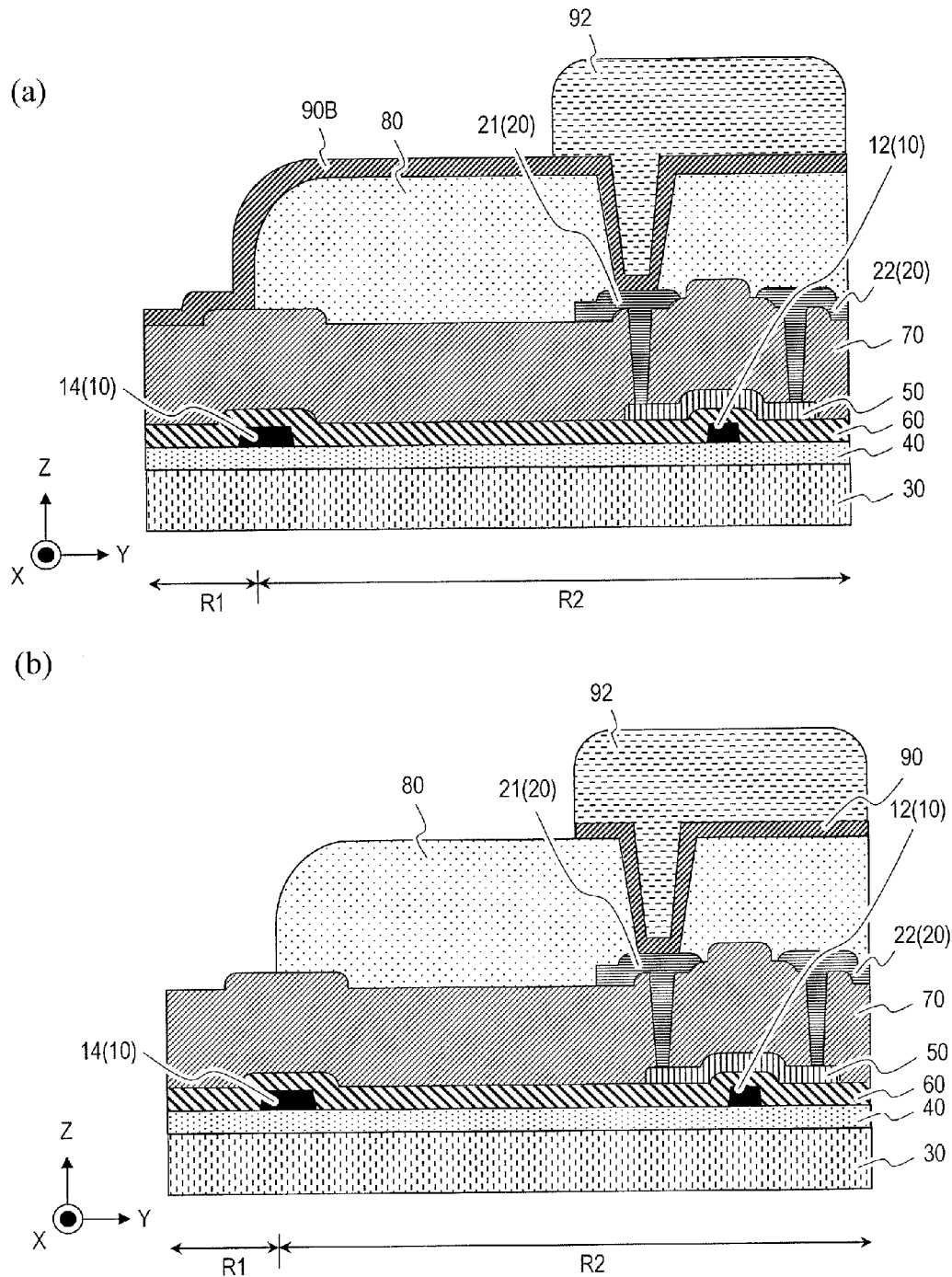
FIGS. 13 (a) and (b) are schematic diagrams illustrating the general procedure of a manufacturing method of a TFT substrate in which a bottom gate type TFT is provided.

Then, as shown in FIG. 11(*a*), a semiconductor layer 50 is formed on the gate insulating layer 60. Note that the channel region of the semiconductor layer 50 is formed so as to overlap the first wires 12.

Then, as shown in FIG. 11(*b*), an insulating layer is formed by, for example, CVD so as to cover the semiconductor layer 50 and the gate insulating layer 60. Here, the insulating layer 70 has a raised portion 70C in which the shape of the raised portion 60C is reflected because the gate insulating layer 60 has the raised portion 60C in which the shape of the island portion 14 is reflected. That is, in the process of forming the insulating layer 70, a step in which the shape of the island portion 14 is reflected is formed in the surface 70S of the insulating layer 70.

Then, contact holes vp1 and vp2 are formed in the insulating layer 70 as shown in FIG. 11(*c*). The subsequent steps are the same as those of the manufacturing process of the TFT substrate 100T. That is, a second metal layer 20 including a plurality of second wires 22 is formed on the insulating layer 70 (see FIG. 12(*a*)). A drain electrode 21 is also formed together with formation of the second wires 22. Then, an insulative material 80R is applied over the insulating layer 70 and the second metal layer 20 (see FIG. 12(*b*)). Then, photolithography is carried out for curing and patterning of the insulative material 80R, whereby an insulative protection layer 80 is formed (see FIG. 12(*c*)).

Then, an electrode film 90B is formed on the insulative protection layer 80 by sputtering or the like, and a resist 92 is applied over the electrode film 90B. Further, the resist 92 is patterned by photolithography (see FIG. 13(*a*)). Thereafter, part of the electrode film 90B which is not covered with the resist 92 is removed by wet etching (see FIG. 13(*b*)). After the wet etching, the resist 92 is removed, whereby the TFT substrate 100B such as shown in FIG. 9 is obtained.

Here, the reasons why the electrically-conductive residue Res occurs in the vicinity of the edge of the insulative protection layer are described in more detail with reference to FIGS. 14(*a*) to 14(*c*).

Figure 2:
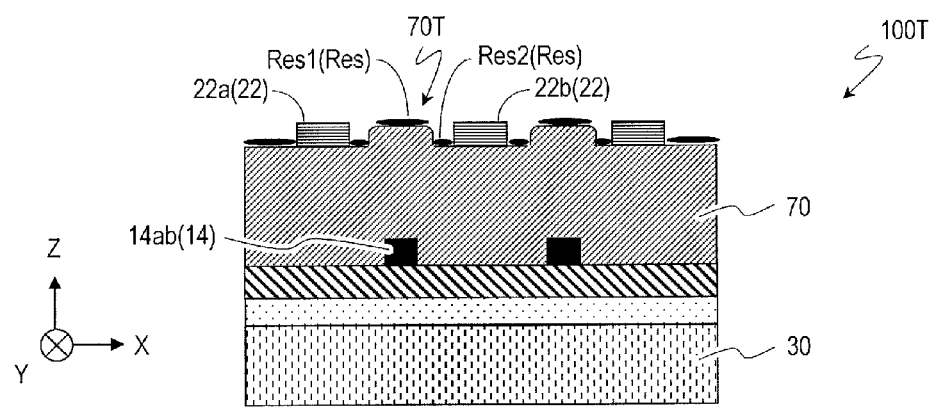
FIG. 2 (a) is a diagram schematically showing that a material which forms an electrically-conductive layer 90 is remaining in the vicinity of the boundary between the first region R1 and the second region R2. (b) and (c) are diagrams respectively showing, for the sake of comparison, a top view and a cross-sectional view of a TFT substrate 500 which does not have a step in the surface of the insulating layer.
Figure 2:
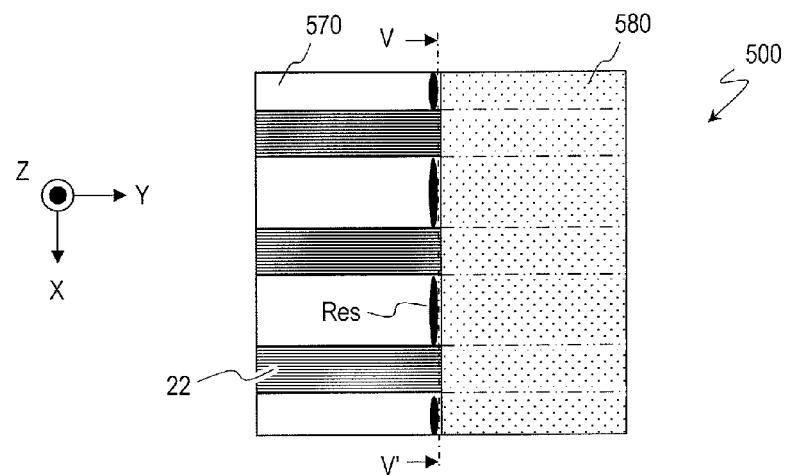
Figure 2:
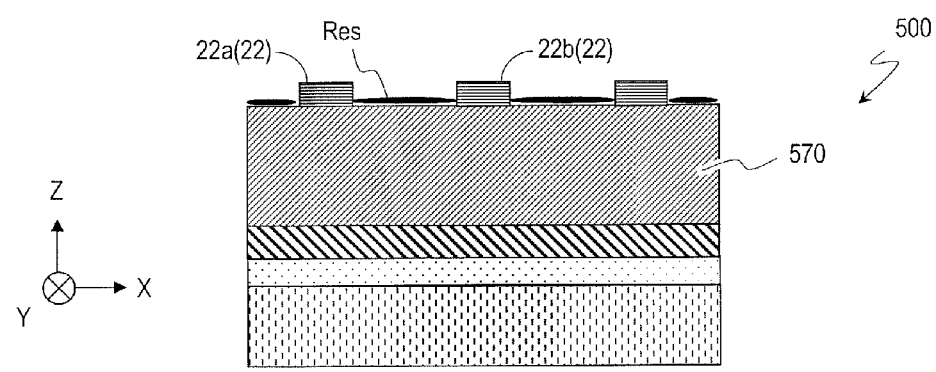
Figure 14:
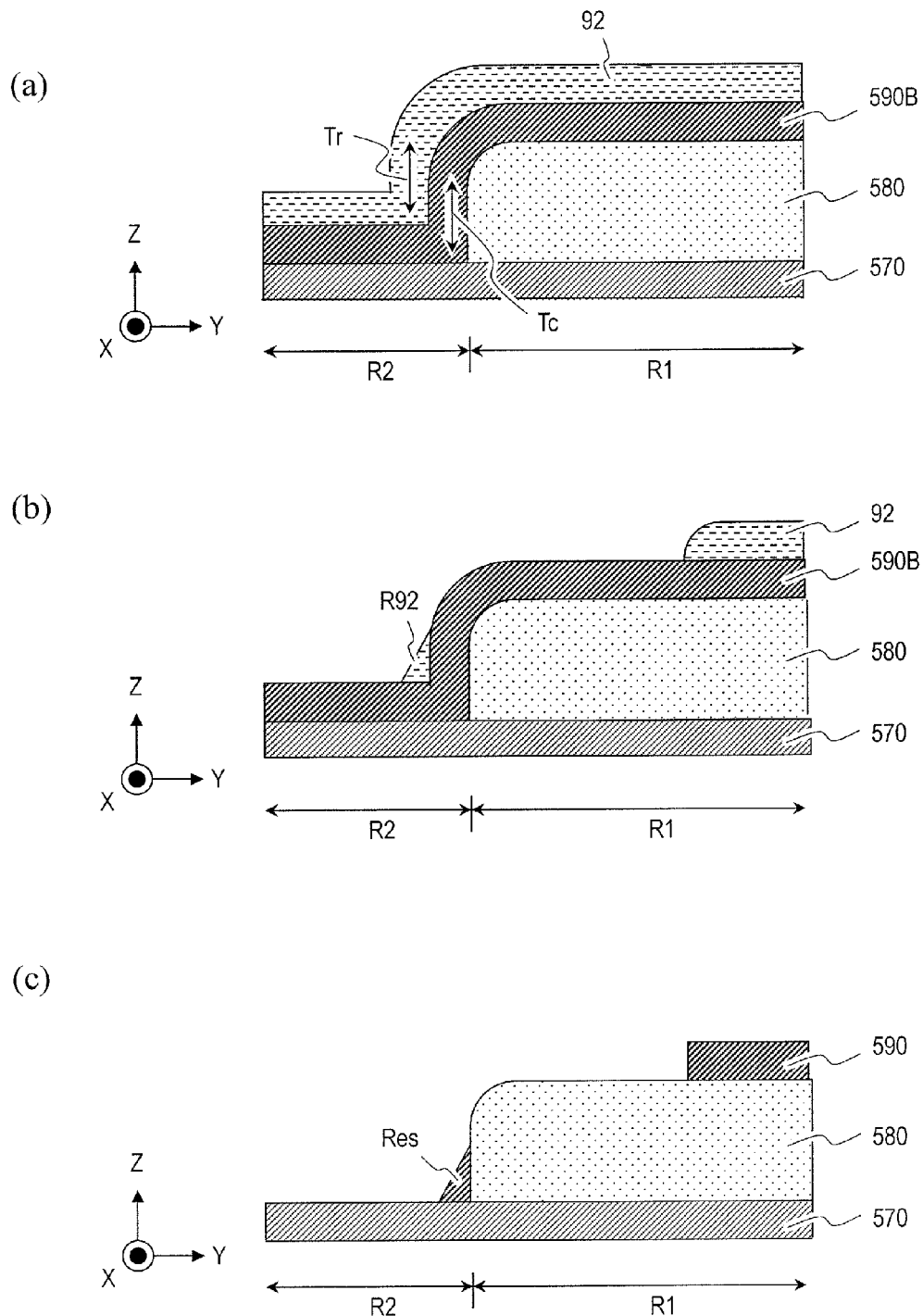
FIG. 14 (a) to (c) are schematic diagrams illustrating the steps of forming an electrically-conductive layer in the manufacturing process of the TFT substrate 500 shown in FIGS. 2(b) and 2(c).
Figure 15:
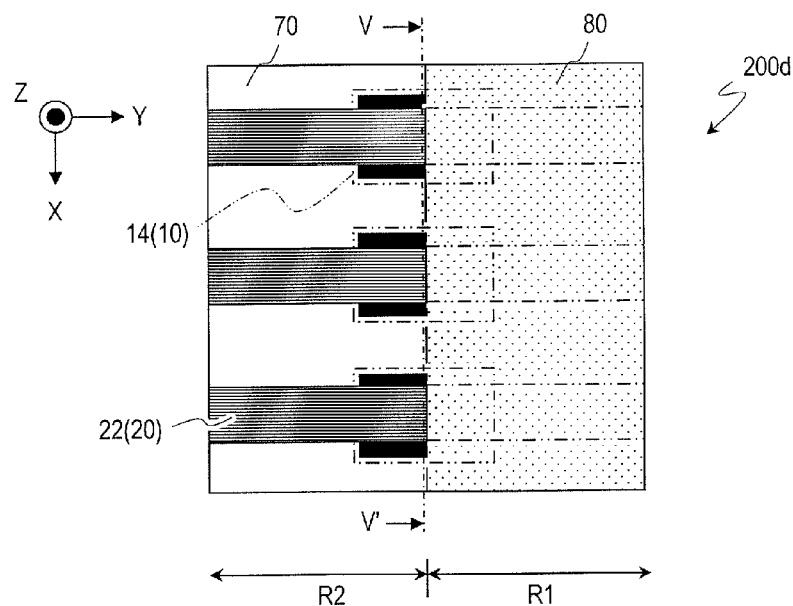
FIGS. 15 (a) and (b) are schematic diagrams showing a TFT substrate 200d according to another embodiment of the present invention.
Figure 15:
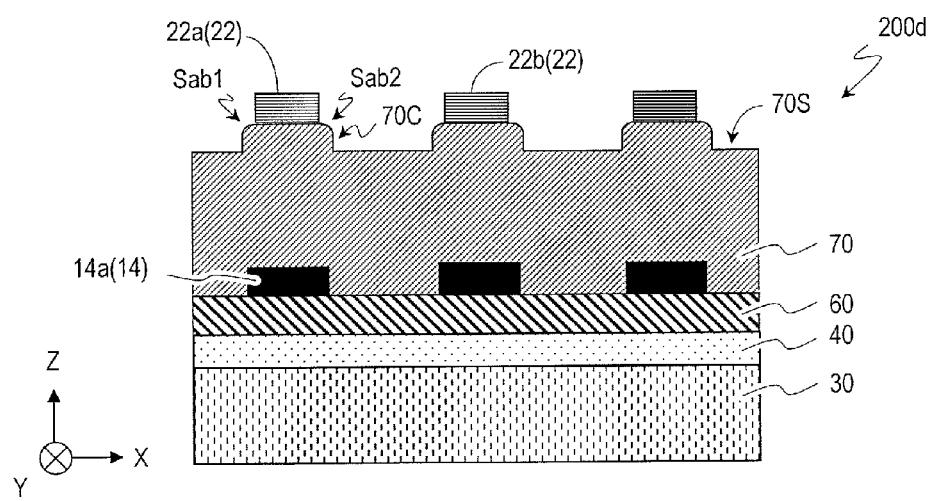
Figure 16:
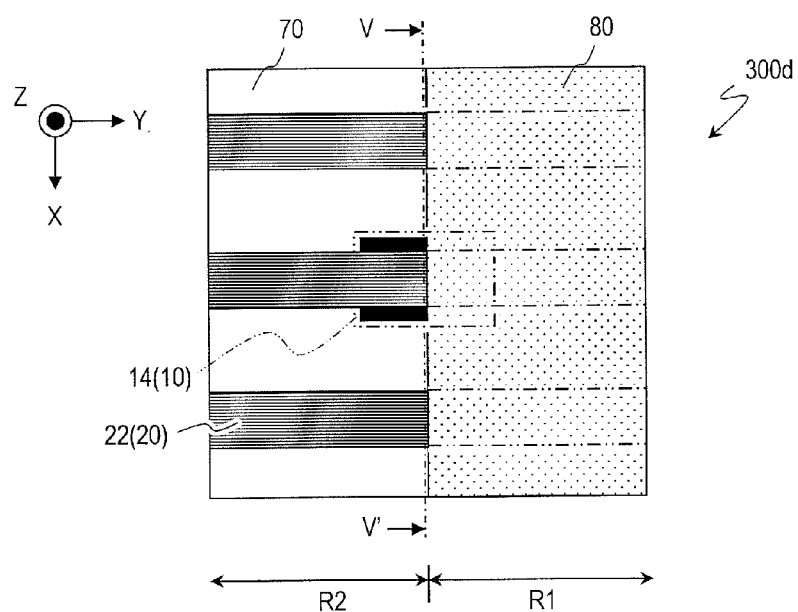
FIGS. 16 (a) and (b) are schematic diagrams showing a TFT substrate 300d according to another embodiment of the present invention.
Figure 16:
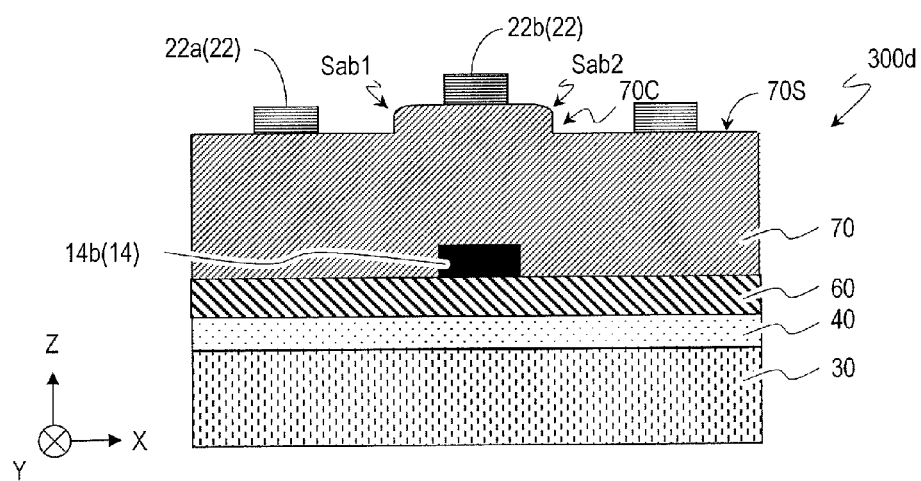

FIGS. 14(*a*) to 14(*c*) are schematic diagrams illustrating the steps of forming an electrically-conductive layer in the manufacturing process of the TFT substrate 500 shown in FIGS. 2(*b*) and 2(*c*). As shown in FIGS. 14(*a*) to 14(*c*), the TFT substrate 500 does not have a step in the surface of the insulating layer 570.

As shown in FIG. 14(*a*), an insulative protection layer 580 is provided on the insulating layer 570. The insulative protection layer 580 covers at least part of the insulating layer 570. Thereby, the first region R1 and the second region R2 are defined on a substrate (not shown) which supports the insulating layer 570 and the insulative protection layer 580.

As previously described by illustration of the TFT substrate 100T and the TFT substrate 100B, an electrode film 590B is formed on the insulative protection layer 580 after formation of the insulative protection layer 580. As shown in FIG. 14(*a*), this electrode film 590B is also formed on part of the insulating layer 570 which is not covered with the insulative protection layer 580. After formation of the electrode film 590B, the resist 92 is provided over the electrode film 590B. The resist 92 is provided over the entire surface of the electrode film 590B as shown in FIG. 14(a). After application of the resist 92, the resist 92 is patterned by photolithography.

As shown in FIG. 14(a), the resist 92 is thicker in a portion in the vicinity of the boundary between the first region R1 and the second region R2 (in the vicinity of the edge of the insulative protection layer 580) than in the other portions (see arrow Tr in FIG. 14(a)). Particularly when the insulative protection layer 580 has a thickness of about several micrometers, the amount of light to which the resist 92 is exposed is likely to be insufficient in the vicinity of the edge of the insulative protection layer 580. Since the amount of the exposure light is thus likely to be insufficient in the vicinity of the edge of the insulative protection layer 580, there is a probability that a resist residue R92 occurs in the vicinity of the edge of the insulative protection layer 580 (see FIG. 14(b)). If there is the resist residue R92, part of the electrode film 590B which is covered with the resist residue R92 will remain without being etched away (see FIG. 14(c)). Thus, the electrically-conductive residue Res is formed in the vicinity of the edge of the insulative protection layer 580. Note that a portion of the electrode film 590B in the vicinity of the edge of the insulative protection layer 580 is thicker than the other portions (see arrow Tc in FIG. 14(a)). Therefore, even if the resist residue R92 is not present, there is a probability that, after the etching, the electrode film 590B remains in the vicinity of the edge of the insulative protection layer 580.

The above-described Patent Documents 1 to 4 suggest suppressing occurrence of a resist residue in order to prevent formation of a leakage path between source wires which adjoin each other. However, the techniques disclosed in Patent Documents 1 to 4 need controlling the shape of an organic insulating film by photolithography, and therefore, there is a probability that they cannot sufficiently suppress occurrence of a resist residue. On the other hand, according to an embodiment of the present invention, a surface of an insulating layer has a step between two second wires which adjoin each other, so that an electrically-conductive residue is divided by the step. Therefore, even if an electrically-conductive residue is present, formation of a leakage path between the second wires can be suppressed. Further, according to an embodiment of the present invention, the step at the surface of the insulating layer is formed by forming an island portion during formation of the first metal film. Therefore, formation of a leakage path can be suppressed without making existing processes more complex.

Hereinafter, another embodiment of the present invention is described with reference to FIG. 15 to FIG. 22.

FIGS. 15(a) and 15(b) are schematic diagrams showing a TFT substrate 200d according to another embodiment of the present invention. FIG. 15(a) corresponds to a top view of the TFT substrate 200d. FIG. 15(b) corresponds to a cross-sectional view of the TFT substrate 200d taken along line V-V' of FIG. 15(a).

In the TFT substrate 200d, each of the plurality of island portions 14 and corresponding one of the plurality of second wires 22 are arranged so as to overlap each other in the vicinity of the edge of the insulative protection layer 80. That is, each of the second wires 22 is provided on the top surface of the raised portion 70C as shown in FIG. 15(b).

In the TFT substrate 100T that has previously been described, the raised portion 70C is provided between two second wires (see, for example, FIG. 1(c)). In other words, the island portion 14 is provided between two second wires. However, the raised portion 70C may be provided at a position overlapping the second wire 22 as shown in FIGS. 15(a) and 15(b). In this case, the number of steps which are present between two second wires is two. So long as steps are thus present between two second wires, the electrically-conductive residue is divided by the steps.

FIGS. 16(a) and 16(b) are schematic diagrams showing a TFT substrate 300d according to another embodiment of the present invention. FIG. 16(a) corresponds to a top view of the TFT substrate 300d. FIG. 16(b) corresponds to a cross-sectional view of the TFT substrate 300d taken along line V-V' of FIG. 16(a).

The TFT substrate 300d is equal to the TFT substrate 200d shown in FIGS. 15(a) and 15(b) in that the island portion 14 and the second wire 22 are arranged so as to overlap each other. The TFT substrate 300d is different from the TFT substrate 200d in that the island portion 14 is provided for every other one of the plurality of second wires 22. As previously described, if there is a step between two second wires, the electrically-conductive residue can be divided by the step. Therefore, the raised portion 70C only needs to be provided at a position overlapping at least one of two second wires. That is, the island portion 14 only needs to be provided at a position overlapping at least one of two second wires.

Figure 17:
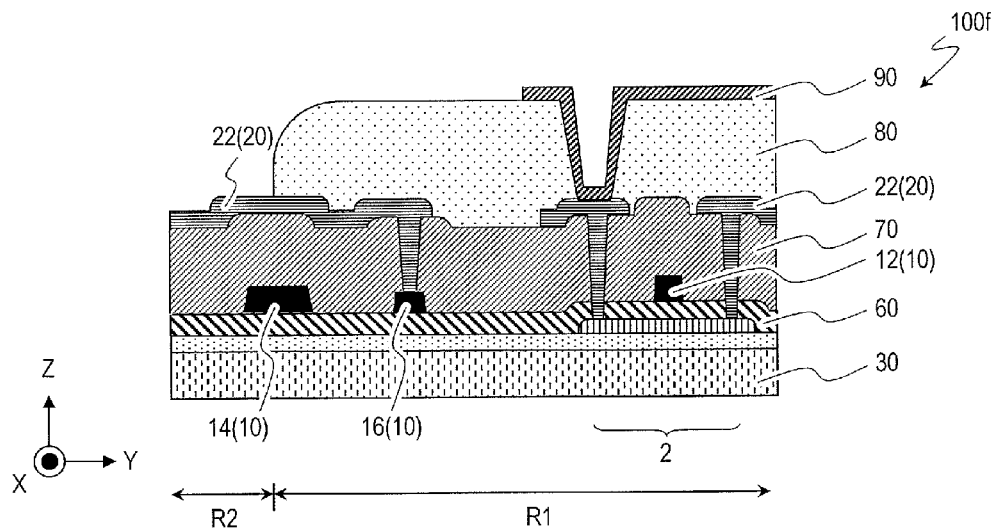
FIG. 17 (a) is a schematic cross-sectional view of a TFT substrate 100f according to another embodiment of the present invention. (b) is a schematic top view of a TFT substrate 100e according to another embodiment of the present invention.
Figure 17:
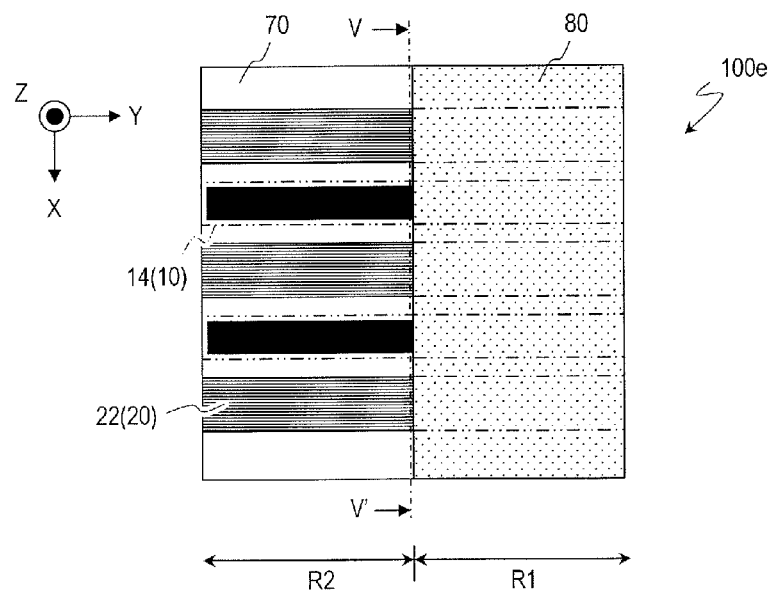
Figure 18:
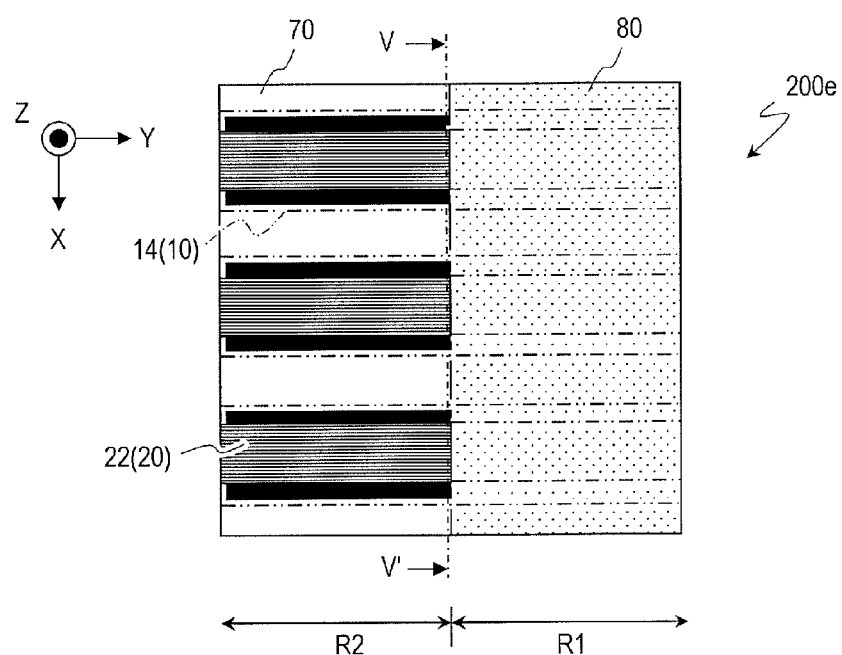
FIGS. 18 (a) and (b) are schematic top views of a TFT substrate 200e and a TFT substrate 300e, respectively, according to other embodiments of the present invention.
Figure 18:
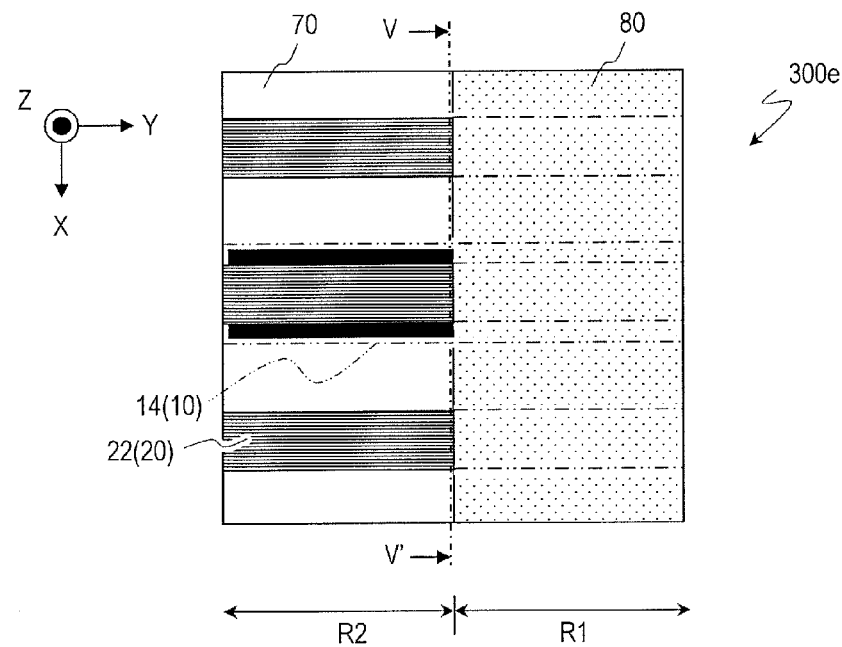
Figure 19:
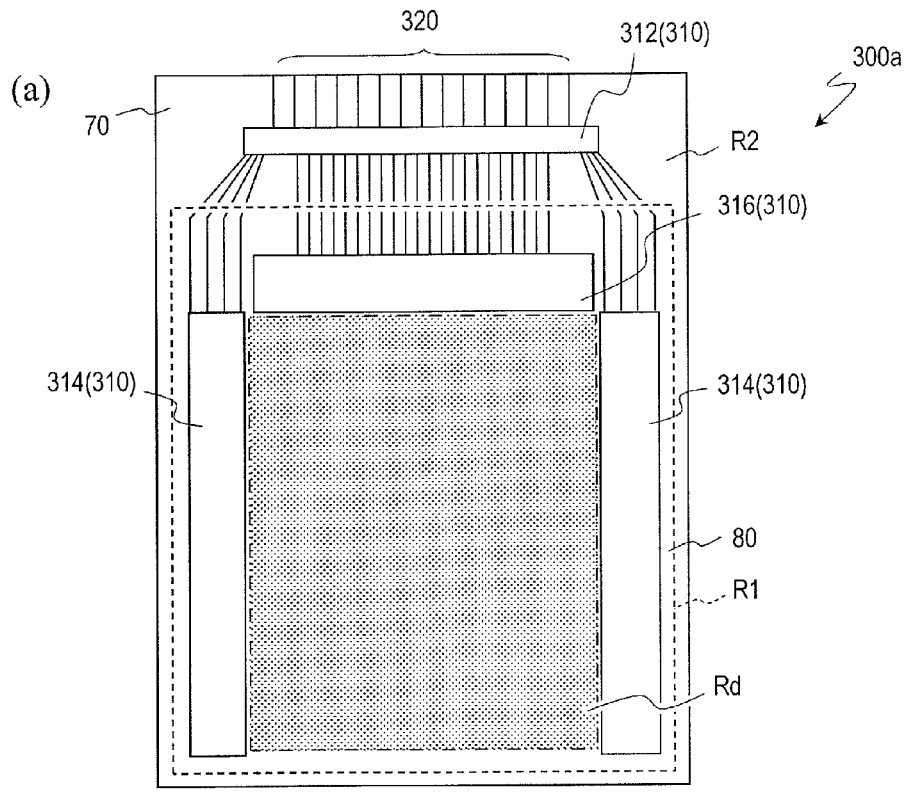
FIG. 19 (a) is a top view showing a TFT substrate 300a according to still another embodiment of the present invention. (b) is an enlarged view of part of (a).
Figure 19:
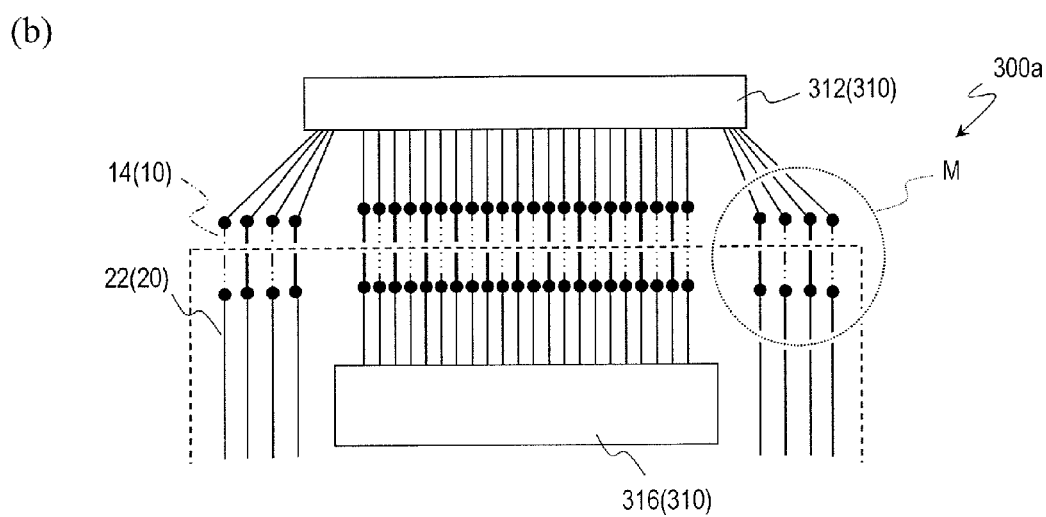
Figure 20:
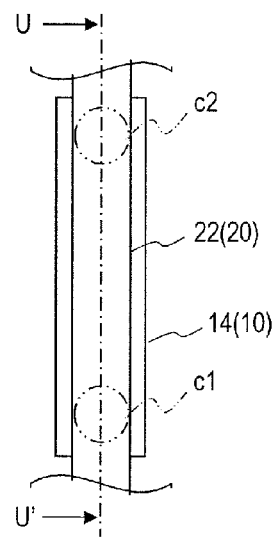
FIG. 20 (a) is an enlarged view of a portion M represented by a broken line in FIG. 19(b). (b) is a cross-sectional view of the TFT substrate 300a taken along line U-U' of (a).
Figure 20:
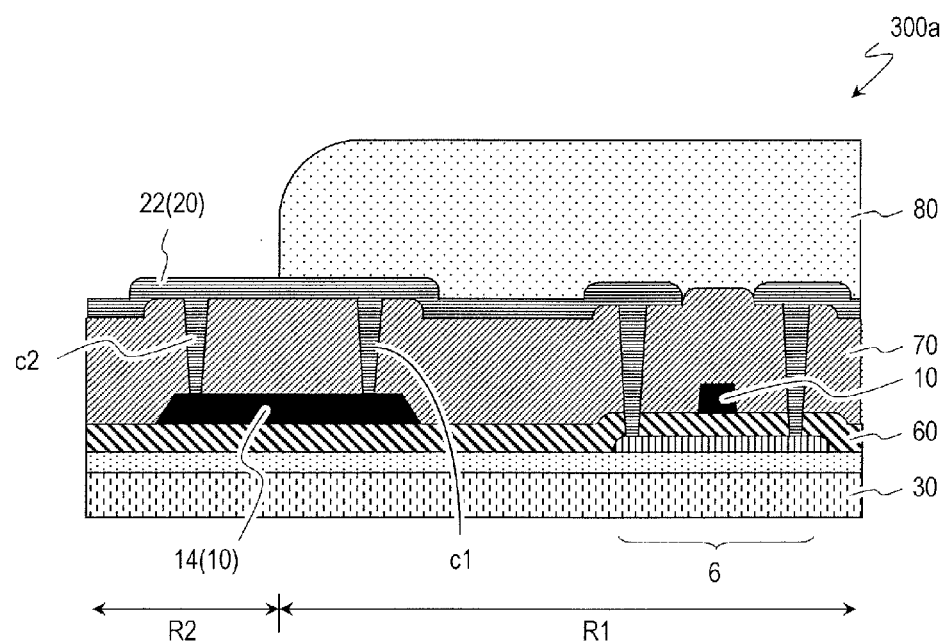
Figure 21:
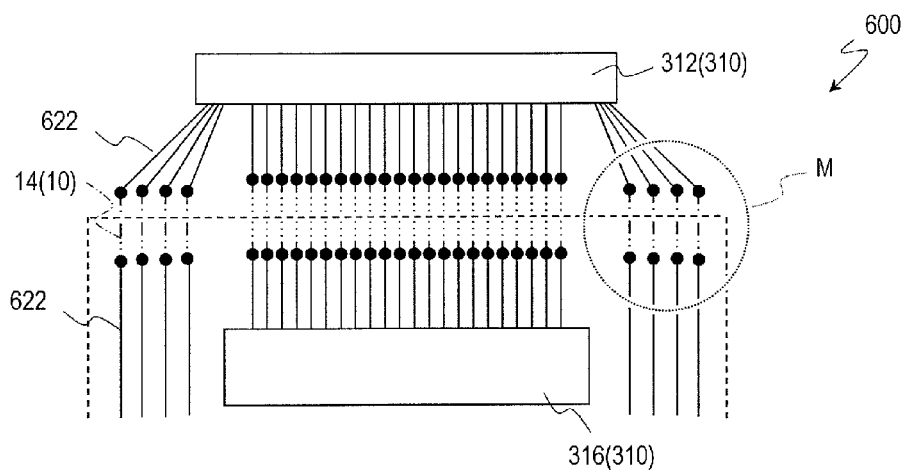
FIG. 21 (a) is a diagram showing, for the sake of comparison, a TFT substrate 600 in which second wires 22 are connected to driving circuits 310 via a first metal layer 10 in the vicinity of the boundary between the first region R1 and the second region R2. (b) is an enlarged view of a portion M represented by a broken line in (a). (c) is a cross-sectional view of the TFT substrate 600 taken along line U-U' of (b).
Figure 21:
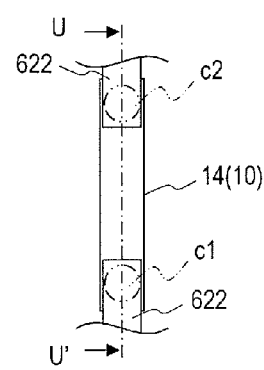
Figure 21:
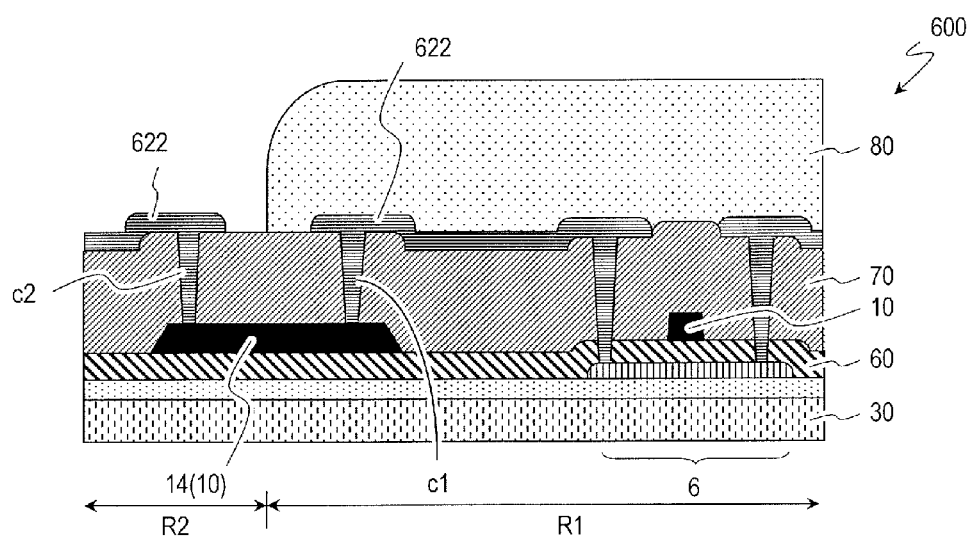
Figure 22:
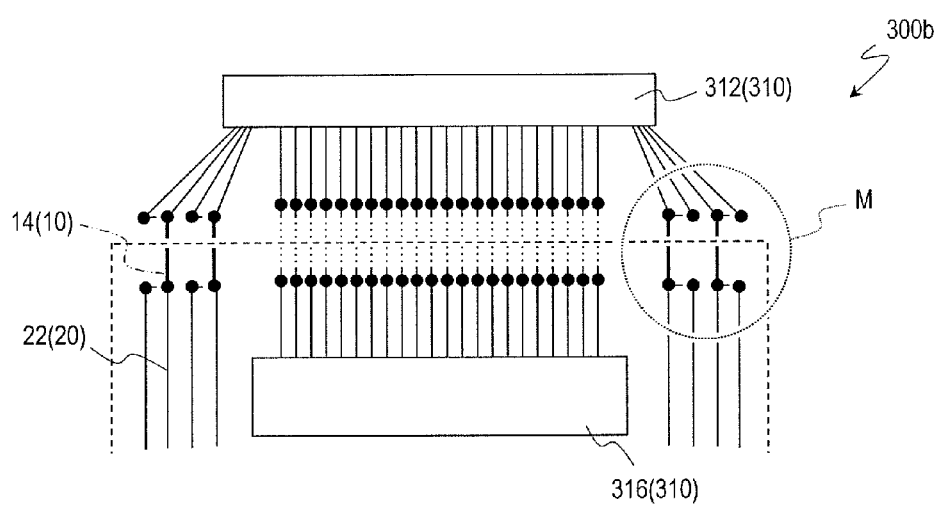
FIG. 22 (a) is a top view showing a TFT substrate 300b according to still another embodiment of the present invention. (b) is an enlarged view of a portion M represented by a broken line in (a). (c) is a cross-sectional view of the TFT substrate 300b taken along line U-U' of (b).
Figure 22:
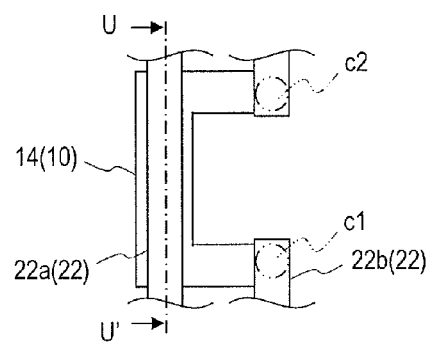
Figure 22:
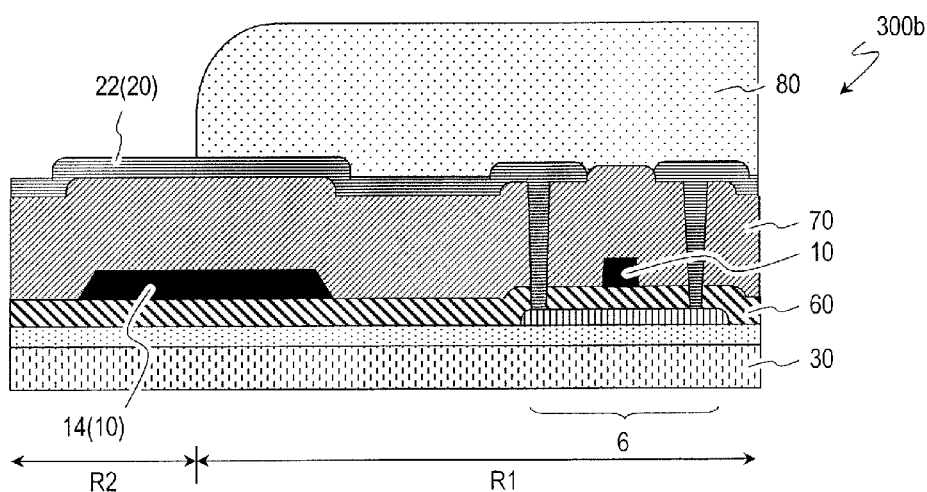

FIG. 17(a) is a schematic cross-sectional view of a TFT substrate 100f according to another embodiment of the present invention. In the example illustrated in FIG. 17(a), a low part wire 16 is provided on a gate insulating film 60. The low part wire 16 is formed in the step of forming the plurality of first wires 12 on the substrate 30. That is, the first metal layer 10 may further include the low part wire 16. The low part wire 16 can be a wire which is connected with the storage capacitor wire 18. Alternatively, the low part wire 16 can be part of the first wires 12. The low part wire 16 can be extended in, for example, the X direction of FIG. 17 (a direction vertical to the sheet of the drawing) and connected to peripheral circuits, such as a driver circuit and the like. In the TFT substrate 100f, the low part wire 16 and the second wire 22 are electrically coupled with each other via a contact hole formed in the insulating layer 70. Thus, the low part wire 16 may be provided on the gate insulating film and coupled with the second wire 22 provided on the insulating layer 70.

FIG. 17(b) is a schematic top view of a TFT substrate 100e according to another embodiment of the present invention. The configuration of a cross section of the TFT substrate 100e taken along line V-V' of FIG. 17(b) is generally equal to the configuration shown in FIG. 1(c), and therefore, illustration thereof is omitted.

As shown in FIG. 17(b), the island portion 14 may be extended such that the island portion 14 and the first wire 12 (not shown) are connected with each other. In this case, the island portion 14 can be electrically coupled with a corresponding one of the plurality of first wires 12. Instead of extending the island portion 14, the first wire 12 may be extended to the second region R2 such that a step is formed in the surface 70S of the insulating layer 70. The island portion 14 and the storage capacitor wire 18 (not shown) may be connected with each other.

FIGS. 18(a) and 18(b) are schematic top views of a TFT substrate 200e and a TFT substrate 300e, respectively, according to other embodiments of the present invention. The configuration of a cross section of the TFT substrate 200e taken along line V-V' of FIG. 18(a) and the configuration of a cross section of the TFT substrate 300e taken along line V-V' of FIG. 18(b) are generally equal to the configurations shown in FIG. 15(b) and FIG. 16(b), respectively, and therefore, illustration thereof is omitted.

FIGS. 18(a) and 18(b) show embodiments where the island portion 14 is extended and the island portion 14 and the first wires 12 (not shown) are connected with each other. In this case, as shown in FIG. 18(a), each of the plurality of island portions 14 and a corresponding one of the plurality of second wires 22 may be arranged so as to overlap each other. Alternatively, as shown in FIG. 18(b), the island portion 14 may be provided for every other one of the plurality of second wires 22.

FIG. 19(a) is a top view showing a TFT substrate 300a according to still another embodiment of the present invention. The TFT substrate 300a is a TFT substrate which has a so-called monolithic configuration where a gate driver circuit and a source driver circuit are integrally formed on a substrate. In the example illustrated in FIG. 19(a), two gate driver circuits 314 and one source driver circuit 316 are provided at three sides of a rectangular display region Rd. In the example illustrated in FIG. 19(a), the gate driver circuits 314 and the source driver circuit 316 are covered with the insulative protection layer 80. Groups of wires drawn out from the gate driver circuits 314 and the source driver circuit 316 are connected to, for example, a controller 312 arranged in the second region R2. The controller 312 is, for example, a timing controller. Terminals 320 for connection to external circuits are connected to the controller 312. Note that, in this specification, the gate driver circuits 314, the source driver circuit 316, the controller 312, and the like, are sometimes generically referred to as driving circuits 310.

Note that the controller 312 may be a discrete component or may be a circuit integrally formed on the substrate. Either or both of the gate driver circuits 314 and the source driver circuit 316 may be a discrete component. The controller 312 may be arranged in the first region R1. That is, the controller 312 may be covered with the insulative protection layer 80. Either or both of the gate driver circuits 314 and the source driver circuit 316 may be arranged in the second region R2. The arrangement of the driving circuits 310 is thus arbitrary. For example, the gate driver circuits 314 and the source driver circuit 316 can be aggregated at a position corresponding to one side of the rectangular display region Rd.

FIG. 19(b) is an enlarged view of part of FIG. 19(a). In the TFT substrate 300a, some of the plurality of second wires 22 provided on the insulating layer 70 extend across the boundary between the first region R1 and the second region R2 (the edge of the insulative protection layer 80) and are connected to the controller 312. In the example illustrated in FIG. 19(b), every other one of the plurality of second wires 22 that are drawn out from the first region R1 toward the second region R2 so as to run parallel to one another is directly connected to the controller 312. In this specification, an embodiment where the second wires 22 extending across the edge of the insulative protection layer 80 are connected to the driving circuit is sometimes referred to as "directly connected". Note that this does not exclude an embodiment where the second wires 22 extending across the edge of the insulative protection layer 80 are connected to the driving circuit via any other electrically-conductive layer, such as the first metal layer 10, in the first region R1 and/or the second region R2.

FIG. 20(a) is an enlarged view of a portion M represented by a broken line in FIG. 19(b). FIG. 20(a) enlargedly shows part of a second wire 22 directly connected to the controller 312. FIG. 20(b) is a cross-sectional view of the TFT substrate 300a taken along line U-U' of FIG. 20(a). A TFT shown in FIG. 20(b) is, for example, a driver TFT included in the gate driver circuit 314.

As shown in FIG. 20(a), in the vicinity of the boundary between the first region R1 and the second region R2, the second wire 22 may be directly connected to the controller 312 (driving circuit 310) without the intervention of the first metal layer 10 that is provided under the insulating layer 70. This arrangement enables reduction of the wire resistance.

Now, the reasons why the wire resistance can be reduced by directly connecting the second wire 22 to the driving circuit 310 without the intervention of any other electrically-conductive layer, such as the first metal layer 10, are described with reference to FIGS. 21(a) to 21(c).

FIG. 21(a) is a diagram showing, for the sake of comparison, a TFT substrate 600 in which second wires 22 are connected to driving circuits 310 via a first metal layer 10 in the vicinity of the boundary between the first region R1 and the second region R2. FIG. 21(b) is an enlarged view of a portion M represented by a broken line in FIG. 21(a). FIG. 21(c) is a cross-sectional view of the TFT substrate 600 taken along line U-U' of FIG. 21(b). In the comparative example illustrated in FIGS. 21(a) to 21(c), second wires 622 in the first region R1 are connected with second wires 622 in the second region R2 via a connecting portion c1, an island portion 14, and a connecting portion c2 at the boundary between the first region R1 and the second region R2.

Usually, the second metal layer 20 that has the second wires is made of, for example, a metal material containing Al, and the sheet resistance of the second metal layer 20 is about $0.1\Omega/\square$. On the other hand, the first metal layer 10 that has island portions is made of, for example, Mo, W, or the like. In this case, the sheet resistance of the first metal layer 10 is about $0.5\Omega/\square$, which is higher than the sheet resistance of the second metal layer 20. Therefore, the intervention of the first metal layer 10 in the vicinity of the boundary between the first region R1 and the second region R2 leads to high wire resistance as compared with a case where the second wires are directly connected to the driving circuits 310. Further, contact resistance also occurs between the connecting portion c1 and the connecting portion c2 and the island portion 14.

Thus, as illustrated in FIG. 19(b), the wire resistance can be reduced by directly connecting the second wires 22 to the driving circuits 310 without the intervention of the first metal layer 10. In this case, as illustrated in FIG. 20(b), the second wire 22 may be connected to the island portion 14 by, for example, the connecting portion c1 and the connecting portion c2 such that the potential of the second wire 22 and the potential of the island portion 14 are equal to each other.

Note that, in the example illustrated in FIG. 19(b), some of the plurality of second wires 22 which are not directly connected to the controller 312 (driving circuit 310) are connected to the driving circuit 310 via the island portions 14 that are arranged so as to lie across the boundary between the first region R1 and the second region R2 (first metal layer 10). As a matter of course, all of the plurality of second wires 22 that are drawn out from the first region R1 toward the second region R2 so as to run parallel to one another may be directly connected to the driving circuit 310. This arrangement enables to further reduce the wire resistance of the whole semiconductor device.

FIG. 22(a) is a top view showing a TFT substrate 300b according to still another embodiment of the present invention. FIG. 22(b) is an enlarged view of a portion M represented by a broken line in FIG. 22(a). FIG. 22(b) enlargedly shows two second wires 22a and 22b which adjoin each other. FIG. 22(c) is a cross-sectional view of the TFT substrate 300b taken along line U-U' of FIG. 22(b).

In the example illustrated in FIGS. 22(a) to 22(c), in the vicinity of the boundary between the first region R1 and the second region R2, the second wire 22a, which is one of the two second wires 22a and 22b that adjoin each other, is directly connected to the driving circuit 310 without the intervention of the first metal layer 10 that is provided under the insulating layer 70. On the other hand, the second wire 22b is connected to the driving circuit 310 with the intervention of the first metal layer 10 that is provided under the insulating layer 70. In the example illustrated in FIGS. 22(a) to 22(c), the island portion 14 which is connected with the second wire 22b has a bent shape such that part of the island portion 14 overlaps the second wire 22a. That is, the island portion which is connected with one of the two adjoining second wires may have such a shape which overlaps the other second wire. In this case also, the effect of reducing the wire resistance is achieved as in the case of the TFT substrate 300a.

In the example of FIGS. 22(a) to 22(c), a configuration has been illustrated in which the island portion which is connected with one of the two second wires that adjoin each other has such a shape which overlaps the other second wire. However, the island portion which is connected with one of two second wires that do not adjoin each other may have such a shape which overlaps the other second wire. The island portion (first metal layer) which is arranged so as to overlap either of the second wires may be a wire which is not connected with the other second wire.

According to an embodiment of the present invention, in a cross section including the boundary between the first region R1 and the second region R2, a surface of the insulating layer 70 which is on the insulative protection layer 80 side has a step between two second wires 22 which adjoin each other. Therefore, formation of a leakage path between the two adjoining second wires 22 is suppressed. Thus, for prevention of a short circuit between the second wires 22, it is not necessary to connect the second wires 22 to the driving circuit 310 with the intervention of the first metal layer 10 in the vicinity of the boundary between the first region R1 and the second region R2. This enables to reduce the wire resistance of the whole semiconductor device. Further, a configuration is possible in which the space between the plurality of second wires 22 is narrowed in the vicinity of the boundary between the first region R1 and the second region R2.

In the foregoing, TFT substrates which are used as a semiconductor device in liquid crystal display devices have been illustrated. However, the semiconductor device may be a TFT substrate for use in other types of display devices than the liquid crystal display devices. The semiconductor device may be, for example, a TFT substrate for use in a display device, such as an organic EL (electroluminescence) display device, an electrophoretic display device, or the like.

INDUSTRIAL APPLICABILITY

Embodiments of the present invention are widely applicable to active matrix substrates, display devices, etc., and particularly, suitably applicable to display devices which have high definition pixels.

REFERENCE SIGNS LIST 100T, 100B TFT substrate (semiconductor device)
10 first metal layer
12 first wire
14 island portion
20 second metal layer
22 second wire
30 substrate
50 semiconductor layer
70 insulating layer
80 insulative protection layer
90 electrically-conductive layer
310 driving circuit

The invention claimed is:

1. A semiconductor device, comprising:
a substrate;
a first metal layer supported on the substrate, the first metal layer including a plurality of first wires;
an insulating layer provided on the first metal layer;
a second metal layer provided on the insulating layer, the second metal layer including a plurality of second wires;
an insulative protection layer covering part of each of the plurality of second wires, the insulative protection layer being arranged to define on the substrate a first region in which the insulative protection layer is provided and a second region in which the insulative protection layer is not provided; and
an electrically-conductive layer provided on the insulative protection layer, wherein
in a cross section including a boundary between the first region and the second region, a surface of the insulating layer which is on the insulative protection layer side has a step between two of the second wires which adjoin each other,
the first metal layer includes an island portion lying in both the first region and the second region, and
the step has a shape in which a contour of the island portion in the cross section is reflected.

2. The semiconductor device of claim 1, wherein the surface includes a portion protruding toward the insulative protection layer side.

3. The semiconductor device of claim 2, wherein the protruding portion is provided at a position overlapping at least one of the two second wires.

4. The semiconductor device of claim 1, wherein the number of steps which are present between the two second wires is one.

5. The semiconductor device of claim 2, wherein the protruding portion is provided between the two second wires.

6. The semiconductor device of claim 1, further comprising a plurality of switching elements supported on the substrate,
wherein each of the plurality of switching elements includes a first contact region, a second contact region, and a channel region lying between the first contact region and the second contact region,
each of the plurality of first wires is arranged so as to overlap the channel region of a corresponding one of the plurality of switching elements, and
the island portion is electrically coupled with a corresponding one of the plurality of first wires.

7. The semiconductor device of claim 1, further comprising a driving circuit placed in the second region
wherein the plurality of second wires include a second wire directly connected to the driving circuit.

8. The semiconductor device of claim 1, wherein the insulative protection layer is a layer which is made of an organic insulative material.

* * * * *